(12) United States Patent
Lu

(10) Patent No.: US 9,070,737 B2
(45) Date of Patent: Jun. 30, 2015

(54) SEMICONDUCTOR DEVICE WITH LOW-LIFETIME REGION

(71) Applicant: FUJI ELECTRIC CO., LTD., Kawasaki (JP)

(72) Inventor: Hong-fei Lu, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 13/712,812

(22) Filed: Dec. 12, 2012

(65) Prior Publication Data

US 2013/0119432 A1    May 16, 2013

Related U.S. Application Data

(63) Continuation of application No. PCT/JP2010/069106, filed on Oct. 27, 2010.

(51) Int. Cl.
*H01L 29/66* (2006.01)
*H01L 29/739* (2006.01)
*H01L 29/06* (2006.01)
(Continued)

(52) U.S. Cl.
CPC ........ *H01L 29/7395* (2013.01); *H01L 29/0619* (2013.01); *H01L 29/0638* (2013.01); *H01L 29/0661* (2013.01); *H01L 29/36* (2013.01); *H01L 29/404* (2013.01); *H01L 29/66333* (2013.01)

(58) Field of Classification Search
CPC .................................... H01L 29/7395
USPC ........................................ 257/139
See application file for complete search history.

(56) References Cited

U.S. PATENT DOCUMENTS

| 5,023,696 A | 6/1991 | Ogino |
| 5,075,751 A | 12/1991 | Tomii et al. |
| 6,040,598 A * | 3/2000 | Nakayama et al. ........... 257/329 |

(Continued)

FOREIGN PATENT DOCUMENTS

| JP | 60-196974 | 10/1985 |
| JP | 64-17476 | 1/1989 |

(Continued)

OTHER PUBLICATIONS

Dongqing Hu, et al., "A New Internal Transparent Collector IGB" IEEE 2009, pp. 287-290.

(Continued)

*Primary Examiner* — Jarrett Stark
*Assistant Examiner* — Mohammad M Hoque

(57) ABSTRACT

A semiconductor device having a p+ collector region in the surface of an n− drift region. The p+ collector region forms a p-n junction with the n− drift region. A collector electrode is in contact with the p+ collector region. A low-lifetime region having a carrier lifetime shorter than in other regions is provided, extending from the n− drift region to the p+ collector region, at the interface between the n− drift region and p+ collector region. The low-lifetime region, being partially activated in accordance with the concentration distribution of a p-type impurity implanted in order to form the p+ collector region, is in a barely activated state. The low-lifetime region has an activation rate lower than that of the p+ collector region. The p+ collector region is completely electrically activated as far as a depth of, for example, 0.5 μm-0.8 μm, from the surface on the collector electrode side.

11 Claims, 28 Drawing Sheets

(51) Int. Cl.
*H01L 29/36* (2006.01)
*H01L 29/40* (2006.01)

(56) References Cited

U.S. PATENT DOCUMENTS

| | | | |
|---|---|---|---|
| 6,121,633 A * | 9/2000 | Singh et al. | 257/77 |
| 6,524,894 B1 * | 2/2003 | Nozaki et al. | 438/138 |
| 2001/0040255 A1 | 11/2001 | Tanaka | |
| 2002/0100934 A1 * | 8/2002 | Nakagawa et al. | 257/330 |
| 2004/0061134 A1 | 4/2004 | Kaneda et al. | |
| 2005/0029568 A1 | 2/2005 | Tokuda et al. | |
| 2006/0038206 A1 | 2/2006 | Shimoyama et al. | |
| 2008/0076238 A1 | 3/2008 | Miyashita et al. | |
| 2008/0085050 A1 | 4/2008 | Barbu et al. | |
| 2008/0173893 A1 | 7/2008 | Hamaguchi et al. | |
| 2009/0032851 A1 | 2/2009 | Pfirsch et al. | |

FOREIGN PATENT DOCUMENTS

| | | |
|---|---|---|
| JP | 1-162368 | 6/1989 |
| JP | 1-272157 | 10/1989 |
| JP | 3-171777 | 7/1991 |
| JP | 11-233764 | 8/1999 |
| JP | 2000-164599 | 6/2000 |
| JP | 2001-326353 | 11/2001 |
| JP | 2002-305305 | 10/2002 |
| JP | 3395520 | 2/2003 |
| JP | 2004-165619 | 6/2004 |
| JP | 2005-93972 | 4/2005 |
| JP | 2005-259779 | 9/2005 |
| JP | 2006-303410 | 11/2006 |
| JP | 2006-319079 | 11/2006 |
| JP | 2006-352101 | 12/2006 |
| JP | 2008-004866 * | 1/2008 |
| JP | 2008-4866 | 1/2008 |
| JP | 2008-85050 | 4/2008 |
| JP | 2008-181975 | 8/2008 |
| JP | 2009-141304 | 6/2009 |

OTHER PUBLICATIONS

Akio Nakgawa, et al., "1800V Bipolar-Mode MOSFETs: a first-application of Silicon-Wafer Direct Bonding (SDB) technique to a power device", IEEE 1986, 5 pages.

International Search Report for PCT/JP2010/069106 mailed Jan. 25, 2011.

Japanese Office Action dated Jan. 27, 2015 in corresponding Japanese Patent Application No. 2012-540576.

* cited by examiner

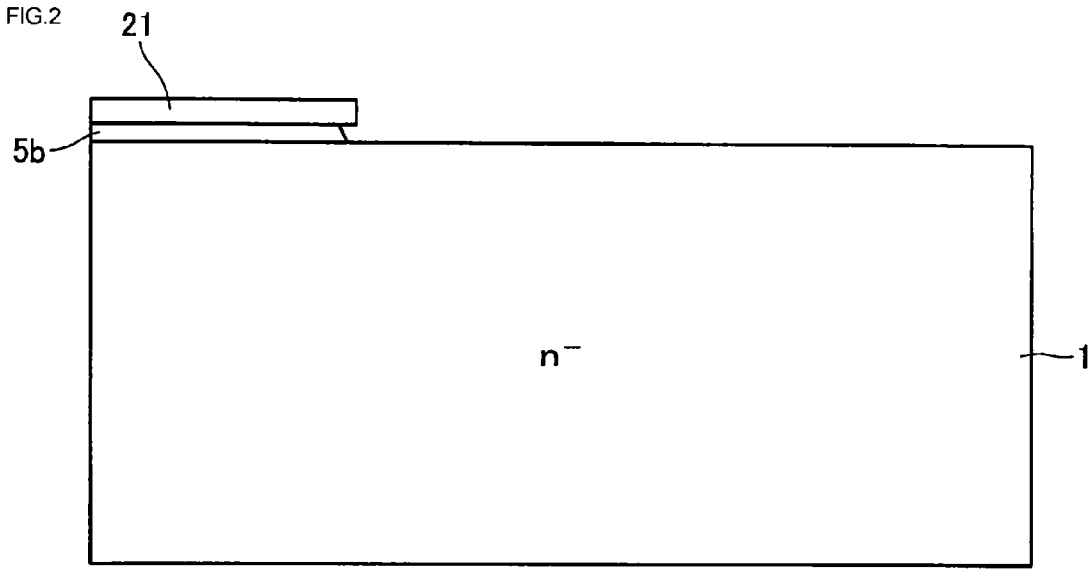
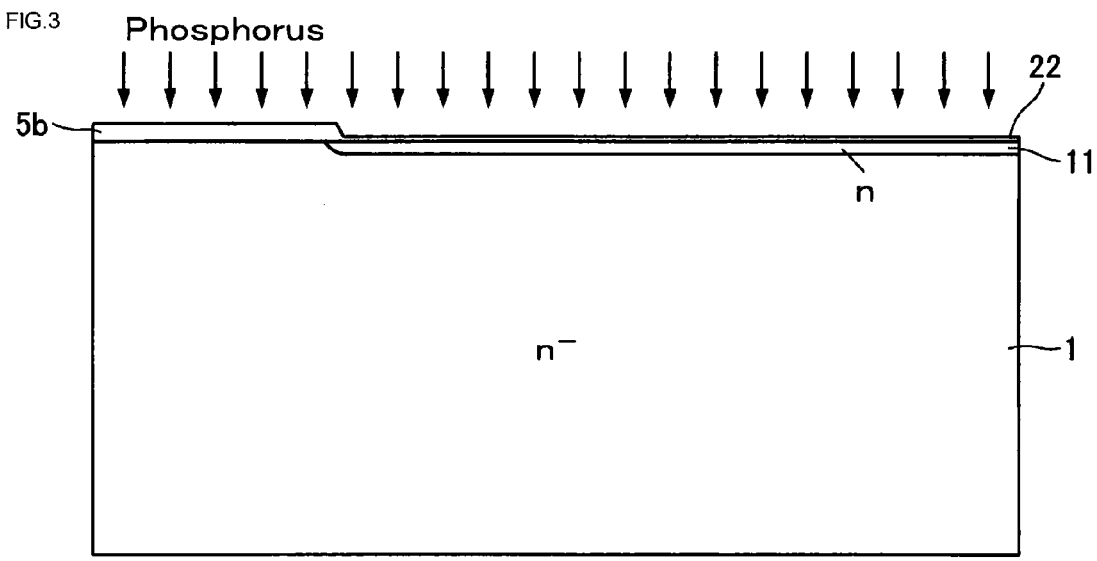

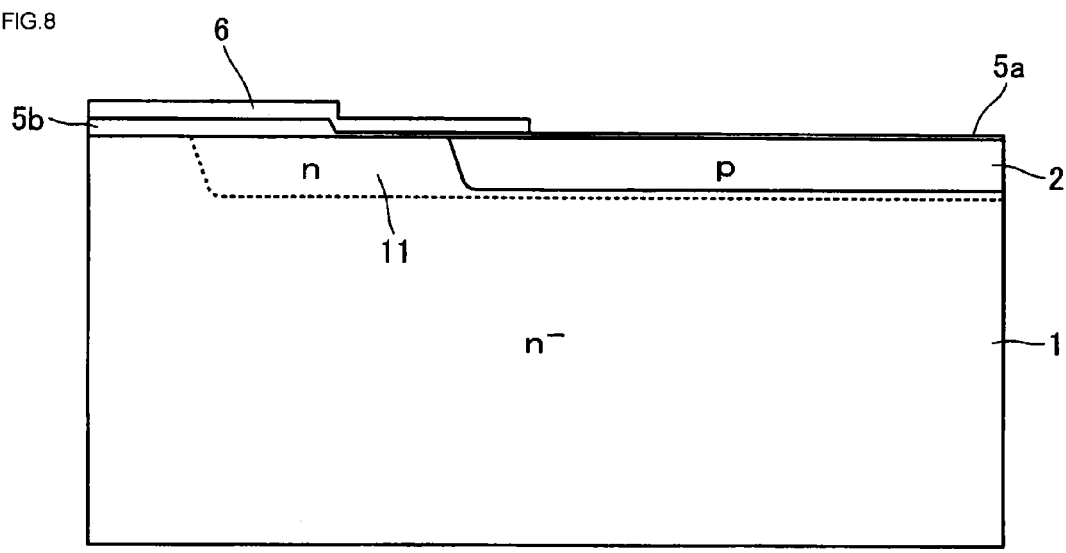
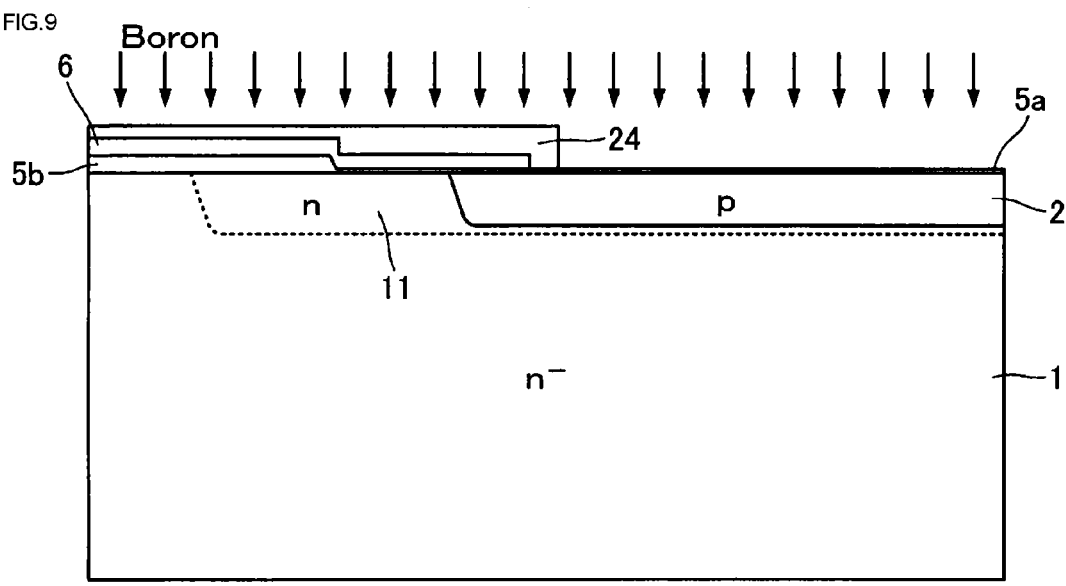

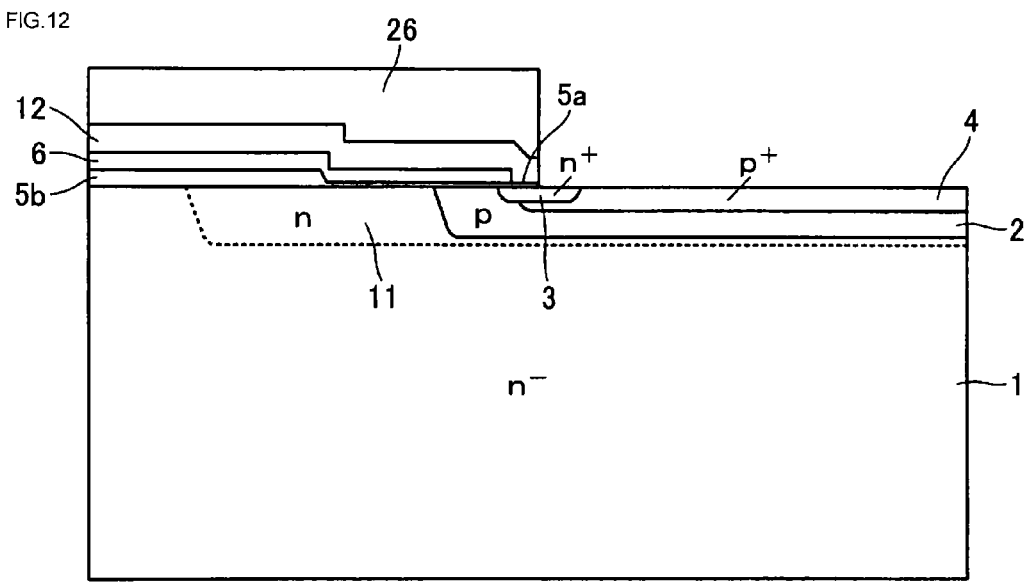
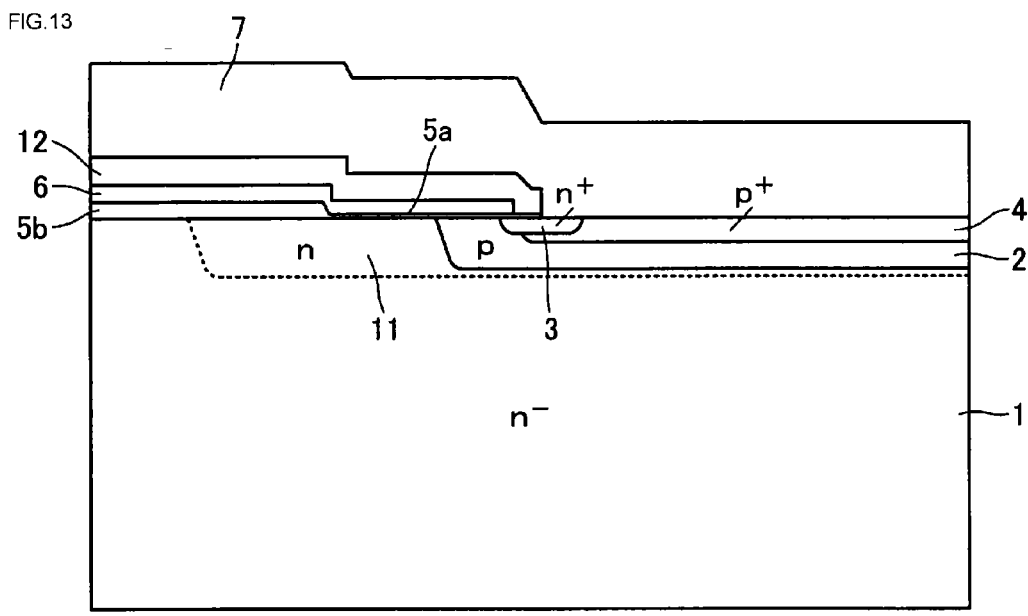

Phosphorus

EXTERNAL PERIPHERY END PORTION SIDE

US 9,070,737 B2

SEMICONDUCTOR DEVICE WITH LOW-LIFETIME REGION

CROSS REFERENCE TO RELATED APPLICATION

This application is a continuation application, filed under 35 U.S.C. §111(a), of International Application PCT/JP2010/069106, filed Oct. 27, 2010, the disclosures of which are hereby incorporated by reference.

BACKGROUND

1. Field

Embodiments of the present invention relate to a semiconductor device and a semiconductor device manufacturing method.

2. Description of the Related Art

A discrete power semiconductor device with a high breakdown voltage plays an important role in a power conversion equipment. For example, an insulated gate bipolar transistor (IGBT), metal oxide semiconductor field effect transistor (MOSFET), and the like, are among commonly known discrete power semiconductor devices. In particular, as the IGBT has the characteristic of low on-state voltage due to the effect of conductivity modulation, it is usually applied when power conversion at a high voltage is needed.

FIG. 26 is a sectional view showing a heretofore known IGBT. In the IGBT shown in FIG. 26, an $n^+$ buffer region 108 and an $n^-$ drift region 102 are stacked on a $p^+$ substrate 101 that forms a $p^+$ collector region. A p-base region 103 and an $n^+$ emitter region 104 are selectively provided in a surface layer of the $n^-$ drift region 102. A gate electrode 106 is provided across a gate insulating film 105 on the p-base region 103 sandwiched by the $n^+$ emitter region 104 and $n^-$ drift region 102 on the surface of the $n^-$ drift region 102. An emitter electrode 107 short circuits the p-base region 103 and $n^+$ emitter region 104.

A description will be given of an action of the IGBT. When a voltage of a threshold value or higher is applied to the gate electrode 106, a channel allowing electrons to pass through is formed in the p-base region 103 in the vicinity of the gate insulating film 105, a voltage drop occurs between the $n^-$ drift region 102 and $n^+$ emitter region 104, and a current flows (conducting state). This voltage drop at a rated current is an on-state voltage $V_{on}$. Electrons are implanted into the $n^-$ drift region 102 from the $n^+$ emitter region 104 side, and holes are implanted from the $p^+$ substrate 101 side. Because of this, the number of electrons and holes in the $n^-$ drift region 102 is far greater than in the $n^+$ buffer region 108 in contact with the $n^-$ drift region 102.

Meanwhile, when the voltage applied to the gate electrode 106 is reduced to the threshold value or lower from the conducting state, the electrons and holes in the $n^-$ drift region 102 move from the $n^-$ drift region 102 to another region, an electron barrier is formed between the $n^-$ drift region 102 and $n^+$ emitter region 104, and the current is cut off. An energy loss $E_{off}$ occurs in the process of transiting from the conducting state to the current cutoff state. In this way, the on-state voltage $V_{on}$ and energy loss $E_{off}$ are in a trade-off relationship.

In the IGBT shown in FIG. 26, in order to improve this kind of IGBT performance trade-off, a region (hereafter referred to as a lifetime control region) 110 that controls minority carrier lifetime is provided in a $p^+$ collector region 109 provided in a surface layer of the $p^+$ substrate 101 on the $n^+$ buffer region 108 side. The lifetime control region 110 is provided in the vicinity of the interface between the $n^+$ buffer region 108 and $p^+$ collector region 109, distanced from the interface.

The following method is proposed as a method of fabricating an IGBT with improved trade-off. The lifetime control region 110 is formed in a surface layer of one main surface of the $p^+$ substrate 101 using ion implantation and annealing. The ion implantation is carried out using an n-type impurity such as, for example, helium (He), with an acceleration energy of 340 keV and a dose of $2.0 \times 10^{15}$ cm$^{-2}$ to $4.0 \times 10^{15}$ cm$^{-2}$. The annealing is carried out, for example, at 700° C. for 60 minutes, with the inside of an annealing furnace in a vacuum state. Next, the $p^+$ collector region 109, $n^+$ buffer region 108, and $n^-$ drift region 102 are stacked, in that order, on the surface of the lifetime control region 110, using epitaxial growth. Next, an IGBT surface structure is formed on the front surface (hereafter referred to as the front surface of the $n^-$ drift region 102) side of an $n^-$ substrate that is to form the $n^-$ drift region 102, thereby completing the IGBT shown in FIG. 26 (for example, refer to Non-patent Document 1).

Also, as another method, the following method is proposed. FIG. 27 is a sectional view showing another example of a heretofore known IGBT. An impurity region that is to form a lifetime control region 220 is formed in a surface layer of one main surface of a $p^+$ substrate 201, using ion implantation. The impurity used in the ion implantation is, for example, tungsten (W) or tantalum (Ta). Next, an $n^-$ drift region 202 is deposited on the surface of the lifetime control region 220, using epitaxial growth. At this time, the impurity region formed in the surface layer of the $p^+$ substrate 201 diffuses to the $n^-$ drift region 202 side. Because of this, the lifetime control region 220 is formed in the vicinity of the interface between the $p^+$ substrate 201 and $n^-$ drift region 202. Next, a trench gate structure portion formed of a $p^+$ base region 203, an $n^+$ emitter region 204, a $p^+$ contact region 208, a gate insulating film 205, a gate electrode 206, and an emitter electrode 207 is formed in a surface layer of the $n^-$ drift region 202, thereby completing the IGBT shown in FIG. 27 (for example, refer to Patent Document 1).

FIG. 28 is a sectional view showing another example of a heretofore known IGBT. An n-buffer region 209 is formed in a surface layer of one main surface of the $p^+$ substrate 201, and an impurity region that is to form the lifetime control region 220 is formed in a surface layer of the n-buffer region 209, using ion implantation. Next, the $n^-$ drift region 202 is formed on the surface of the n-buffer region 209. In this case, by the impurity ion implanted into the surface layer of the n-buffer region 209 being diffused to the $n^-$ drift region 202, the lifetime control region 220 is formed in the vicinity of the interface between the n-buffer region 209 and $n^-$ drift region 202. The method of forming regions other than these is the same as for the IGBT shown in FIG. 27.

FIG. 29 is a sectional view showing another example of a heretofore known IGBT. In the IGBT shown in FIG. 29, a non-activated region (lifetime control region) 210 is provided between the $n^-$ drift region 202 and n-buffer region 209. The lifetime control region 210 is formed as follows. The n-buffer region 209 and a $p^+$ collector region 211 are formed sequentially in a surface layer of the rear surface (hereafter referred to as the rear surface of the $n^-$ drift region 202) of a substrate that is to form the $n^-$ drift region 202, using ion implantation and annealing. Next, an ion implantation for forming the lifetime control region 210 is carried out from the $p^+$ collector region 211 side into the $n^-$ drift region 202. The ion implantation conditions are, for example, using an n-type impurity such as phosphorus (P), an acceleration energy of 500 keV, and a dose of $1.0 \times 10^{14}$ cm$^{-2}$. Next, a collector electrode 212 in contact with the $p^+$ collector region 211 is formed. The lifetime control region 210 is formed by thermal diffusion due to heat treatment for forming the collector electrode 212 (for example, refer to Patent Document 2).

FIGS. 30 to 33 are sectional views sequentially showing a method of manufacturing another example of a heretofore known IGBT. As shown in FIG. 30, firstly, the n⁺ buffer region 108 is formed in the surface layer of one main surface of an n⁻ substrate that is to form the n⁻ drift region 102, using ion implantation and annealing. An n-type impurity such as, for example, phosphorus is used in the ion implantation. Next, as shown in FIG. 31, an ion implantation for forming the lifetime control region 120 is carried out into the surface of the n⁺ buffer region 108. The ion implantation is carried out using, for example, argon (Ar) or the like, with an acceleration energy of 150 keV, and a dose of $3.0 \times 10^{15}$ cm⁻². Next, as shown in FIG. 32, the face of the n⁻ substrate on the side on which the n⁺ buffer region 108 is formed, and the p⁺ substrate 101 prepared in advance, are bonded together. Next, the n⁻ substrate is thinned by grinding from the face of the n⁻ substrate on the side opposite to the face on the side on which the n⁺ buffer region 108 is formed. Next, as shown in FIG. 33, a planar gate structure portion is formed in the same way as for the IGBT shown in FIG. 26. The lifetime control region 120 is formed by the heat treatment in each step or process in the vicinity of the interface between the n⁻ drift region 102 and n⁺ buffer region 108. That is, the lifetime control region 120 is provided away from a junction 113 at which the n⁻ substrate and p⁺ substrate 101 are bonded together (for example, refer to Patent Document 3 and Non-patent Document 2).

FIG. 34 is a sectional view showing another example of a heretofore known IGBT. In the IGBT shown in FIG. 34, an n-type impurity such as arsenic (As) is implanted into the rear surface of an n⁻ substrate that is to form the n⁻ drift region 202. Next, an annealing process (laser annealing process) is carried out by irradiating the rear surface of the n⁻ substrate in a striped form with a laser, leaving gaps at equal intervals. By so doing, an n-buffer region 240 and lifetime control region 250 activated in a striped form are formed simultaneously. Next, the p⁺ collector region 211 is formed by implanting a p-type impurity such as boron (B) into the surfaces of the n-buffer region 240 and lifetime control region 250, and carrying out a laser annealing process. Next, the collector electrode 212 in contact with the p⁺ collector region 211 is formed, thereby completing the IGBT shown in FIG. 34. The method of forming regions other than these is the same as for the IGBT shown in FIG. 27 (for example, refer to Patent Document 4).

Also, a reverse blocking IGBT (RB-IGBT), in which a termination structure is provided to realize a high breakdown voltage (hereafter referred to as a reverse breakdown voltage) when reverse bias is applied to a p-n junction formed of a collector region and drift region of a heretofore known IGBT, is commonly known. In RB-IGBT, in the same way as in the heretofore described IGBTs, the on-state voltage and energy loss are also in a trade-off relationship.

FIG. 35 is a sectional view showing a heretofore known reverse blocking IGBT. In the reverse blocking IGBT shown in FIG. 35, a p-collector region 111 is provided in a surface layer of the rear surface of an n⁻ substrate that is to form the n⁻ drift region 102. A collector electrode 112 is in contact with the p-collector region 111. A p-type through-silicon isolation region 130, which penetrates through the n⁻ drift region 102 from the front surface of the n⁻ drift region 102, reaching the p-collector region 111, is provided in an outer peripheral end portion of the n⁻ drift region 102. A field plate 131 is in contact with the isolation region 130. A floating p-region 141 and a field plate 142 in contact with the p-region 141 being provided on the front surface side of the n⁻ drift region 102, a termination structure 140 formed of the p-region 141 and field plate 142 is formed. The isolation region 130 and termination structure 140 surround an active region 100 through which a drift current flows. A p⁺ contact region 122 in contact with the n⁺ emitter region 104 is provided in a surface layer of the p-base region 103 in the active region 100. An n-region 121, which covers the p-base region 103 to a region below the p-base region 103, is provided in the surface layer of the n⁻ drift region 102. Configurations of the active region 100 other than this are the same as in the IGBT shown in FIG. 26.

As shown in FIG. 35, it is necessary to form the isolation region 130 in the outer peripheral end portion of the n⁻ drift region 102 in order to fabricate the reverse blocking IGBT. The following method is proposed as a method of forming the isolation region 130. A p-type impurity such as boron (B) is selectively implanted into the front surface of the n⁻ drift region 102, forming a p-impurity region, and diffused for a long time at a high temperature. This p-impurity region is the isolation region 130. Next, the IGBT surface structure is formed on the front surface side of the n⁻ substrate. Next, the rear surface of the n⁻ substrate is ground until the isolation region 130 is exposed. By so doing, the isolation region 130 is formed reaching the p-collector region 111 from the front surface of the n⁻ drift region 102.

Also, as another method, the following method is proposed. FIG. 36 is a sectional view showing the manufacturing process of a heretofore known reverse blocking IGBT. As shown in FIG. 36, a p-type impurity is implanted into the whole of the rear surface of an n⁻ substrate that is to form the n⁻ drift region 102, and diffused. By so doing, the p-collector region 111 is formed over the whole of the rear surface of the n⁻ drift region 102. Next, a p-type impurity is selectively implanted into the front surface of the n⁻ substrate that is to form the n⁻ drift region 102, thereby forming a p-type impurity region. Next, the p-type impurity region is diffused until it reaches the p-collector region 111. The isolation region 130 is formed reaching the p-collector region 111 from the front surface of the n⁻ drift region 102 (for example, refer to Patent Document 5 (FIG. 2)).

FIG. 37 is a sectional view showing a heretofore known reverse blocking IGBT. In the reverse blocking IGBT shown in FIG. 37, a p-type isolation region 150 is provided along the side walls of a trench reaching the p-collector region 111 from the front surface of the n⁻ drift region 102, connecting with the p-collector region 111. The trench surrounds the active region 100 and termination structure 140 of the n⁻ drift region 102. A filling material 151 is embedded inside the trench. Configurations other than this are the same as in the reverse blocking IGBT shown in FIG. 35.

As a method of forming this kind of trench structure isolation region, there is proposed a method whereby a process of forming a second conductivity type first impurity region on the second main surface side of a first conductivity type semiconductor substrate having a first main surface and a second main surface opposing the first main surface, a process of forming a trench in a peripheral region of the semiconductor substrate so as to reach the first impurity region from the first main surface, using anisotropic etching, and a process of forming a second impurity region by introducing a second conductivity type impurity into the semiconductor substrate from a trench side wall using ion implantation, are sequentially carried out (for example, refer to Patent Document 6).

FIG. 38 is a sectional view showing another example of a heretofore known reverse blocking IGBT. In the reverse blocking IGBT shown in FIG. 38, a p+-type isolation region 160 and the reverse blocking IGBT surface structure are formed on the (100) plane (front surface) side of the n− drift region 102. The IGBT surface structure is the same as in the reverse blocking IGBT shown in FIG. 35. Next, the n− drift region 102 is thinned to a predetermined thickness from the rear surface side of the n− drift region 102. Next, a depressed portion 161 is formed, penetrating the n− drift region 102 from the rear surface side of the n− drift region 102, and reaching the front surface. Herein, the side walls of the depressed portion 161 form an angle of, for example, 54.7° with the rear surface of the n− drift region 102. Next, using ion implantation and annealing, the p-collector region 111 is formed in the rear surface of the n− drift region 102, and a p+ region 162 is formed in the side walls of the depressed portion 161. Because of this, the isolation region 160 is formed connected to the p-collector region 111 across the p+ region 162.

The following kind of method is proposed as a method of forming an isolation region in a reverse blocking IGBT wherein the outer peripheral end portion is thinner than the active region side in this way. The surface of a thin semiconductor wafer on which is formed a surface structure configuring a semiconductor chip is attached to a support substrate with two-sided adhesive tape. Next, a trench that is to form a scribe line is formed from the rear surface of the thin semiconductor wafer using wet anisotropic etching, exposing the crystal surface. Next, an isolation layer that maintains reverse breakdown voltage in the side surfaces of the trench in which the crystal surface is exposed is formed simultaneously with a p-collector region, which is a rear surface diffusion layer, using ion implantation and low temperature annealing or laser annealing (for example, refer to Patent Document 7).

RELATED ART DOCUMENTS

Patent Documents

Patent Document 1: U.S. Patent Application Publication No. 2009/0032851
Patent Document 2: U.S. Pat. No. 6,524,894
Patent Document 3: U.S. Pat. No. 5,023,696
Patent Document 4: JP-A-2008-181975
Patent Document 5: JP-A-2004-165619
Patent Document 6: JP-A-2005-093972
Patent Document 7: JP-A-2006-303410

Non-Patent Documents

Non-patent Document 1: Dongqing Hu et al, "A New Internal Transparent Collector IGB", 21$^{st}$ International Symposium on Power Semiconductor Devices & IC's 2009 (Barcelona), Jun. 14-18, 2009, pages 287 to 290.
Non-patent Document 2: Akio Nakagawa et al, "1800V Bipolar-Mode MOSFETs: A First Application of Silicon Wafer Direct Bonding (SDB) Technique to a Power Device", 1986 International Electron Devices Meeting (USA), 1986, Volume 32, pages 122 to 125.

SUMMARY

Problems Addressed by Embodiments of the Invention

However, with the heretofore described IGBTs shown in FIGS. 26 to 34, there is an increase in ion implantation processes solely for forming a lifetime control region. Also, with the IGBTs shown in FIGS. 26 and 33, the dose when implanting ions is high, being as high as in the region of $1.0 \times 10^{15}$ cm$^{-2}$ and $1.0 \times 10^{16}$ cm$^{-2}$ respectively, meaning that there is a problem in that the manufacturing cost increases. With the IGBTs shown in FIGS. 27 and 28, a special ion implantation device for forming a lifetime control region is needed, meaning that there is a problem in that it is not possible to place the IGBT on a general manufacturing line. With the IGBT shown in FIG. 34, it is necessary to carry out two laser annealing processes, using single wafer processing, meaning that there is a problem in that throughput decreases.

In order to eliminate the problems with the heretofore described heretofore technology, embodiments of the invention have an object of providing a semiconductor device and semiconductor device manufacturing method with which it is possible to improve the trade-off relationship between on-state voltage and energy loss. Embodiments of the invention have an object of providing a semiconductor device and semiconductor device manufacturing method with which electrical characteristics are improved. Also, embodiments of the invention have an object of providing a semiconductor device and semiconductor device manufacturing method with which it is possible to reduce manufacturing cost. Also, embodiments of the invention have an object of providing a semiconductor device and semiconductor device manufacturing method with which it is possible to efficiently fabricate the semiconductor device.

Means for Solving the Problems

As used in this section, each of the "aspects" described below refers to a set of features existing in exemplary embodiments of the invention.

In order to solve the heretofore described problems, and achieve objects of the invention, a semiconductor device according to a first aspect of the invention has the following characteristics. The semiconductor device includes a first conductivity type first semiconductor region, a second conductivity type second semiconductor region, in contact with the first semiconductor region, that forms a p-n junction with the first semiconductor region, and a low-lifetime region provided at the interface between the first semiconductor region and second semiconductor region, electrically activated in accordance with a second conductivity type impurity concentration distribution of the second semiconductor region, that has a carrier lifetime shorter than that in other regions.

Also, a semiconductor device according to a second aspect of the invention is characterized in that, in the first aspect (for example), the low-lifetime region is provided extending from the first semiconductor region to the second semiconductor region.

Also, a semiconductor device according to a third aspect of the invention is characterized in that, in the second aspect (for example), the low-lifetime region is provided at a depth 0.4 µm or more, 1.2 µm or less, from the surface on the side opposite the plane in which the second semiconductor region is in contact with the first semiconductor region.

Also, in order to solve the heretofore described problems, and achieve objects of the invention, a semiconductor device according to a fourth aspect of the invention has the following characteristics. The semiconductor device includes a first conductivity type first semiconductor region, a first conductivity type fifth semiconductor region, provided in a surface layer of the first semiconductor region, with a resistivity lower than that of the first semiconductor region, a second conductivity type second semiconductor region, in contact with the fifth semiconductor region, that forms a p-n junction with the fifth semiconductor region, and a low-lifetime region provided at the interface between the fifth semiconductor region and second semiconductor region, electrically activated in accordance with a second conductivity type impurity concentration distribution of the second semiconductor region, that has a carrier lifetime shorter than that in other regions.

Also, a semiconductor device according to a fifth aspect of the invention is characterized in that, in the fourth aspect (for example), the low-lifetime region is provided extending from the fifth semiconductor region to the second semiconductor region.

Also, a semiconductor device according to a sixth aspect of the invention is characterized in that, in the fifth aspect (for example), the low-lifetime region is provided at a depth 0.4 μm or more, 1.2 μm or less, from the surface on the side opposite the plane in which the second semiconductor region is in contact with the fifth semiconductor region.

Also, a semiconductor device according to a seventh aspect of the invention is characterized in that, in any one of the first through sixth aspects (for example), the activation rate of the low-lifetime region is lower than the activation rate of the second semiconductor region.

Also, a semiconductor device according to an eighth aspect of the invention is characterized in that, in any one of the first through sixth aspects (for example), a portion as far as a depth of 0.5 μm or more, 0.8 μm or less, from the surface on the side opposite the plane in which the second semiconductor region is in contact with the first semiconductor region is electrically activated.

Also, a semiconductor device according to a ninth aspect of the invention is characterized by, in the first aspect (for example), further including a second conductivity type third semiconductor region selectively provided in a surface layer of the first semiconductor region on the side opposite the plane on the side on which the second semiconductor region is provided, a first insulating film provided extending from the first semiconductor region to the surface of the third semiconductor region, a second insulating film, of a thickness greater than that of the first insulating film, provided in contact with the first insulating film on the surface of the first semiconductor region, a first electrode provided on the first insulating film and second insulating film, a first conductivity type fourth semiconductor region provided aligned with an end portion of the first electrode in one portion of a surface layer of the third semiconductor region, a second electrode in contact with the third semiconductor region and fourth semiconductor region, and a third electrode in contact with the second semiconductor region.

Also, a semiconductor device according a tenth aspect of the invention further includes, in the ninth aspect (for example), a second conductivity type sixth semiconductor region selectively provided in the surface layer of the third semiconductor region, and covering a region below the fourth semiconductor region, with a resistivity lower than that of the third semiconductor region. Further, the second electrode is characterized by being in contact with the fourth semiconductor region and sixth semiconductor region.

Also, a semiconductor device according an eleventh aspect of the invention is characterized by, in the first aspect (for example), including a second conductivity type third semiconductor region selectively provided in a surface layer of the first semiconductor region on the side opposite the plane on the side on which the second semiconductor region is provided, a first electrode embedded across a first insulating film inside a trench penetrating the third semiconductor region and reaching the first semiconductor region, a first conductivity type fourth semiconductor region selectively provided in the surface layer of the third semiconductor region and neighboring the first electrode across the first insulating film provided on the side walls of the trench, a second electrode in contact with the third semiconductor region and fourth semiconductor region, and a third electrode in contact with the second semiconductor region.

Also, a semiconductor device according to a twelfth aspect of the invention further includes, in the eleventh aspect (for example), a second conductivity type sixth semiconductor region selectively provided in the surface layer of the third semiconductor region, and covering a region below the fourth semiconductor region, with a resistivity lower than that of the third semiconductor region. Further, the second electrode is characterized by being in contact with the fourth semiconductor region and sixth semiconductor region.

Also, in order to solve the heretofore described problems, and achieve objects of the invention, a semiconductor device manufacturing method according to a thirteenth aspect of the invention for manufacturing a semiconductor device having a p-n junction formed of a first conductivity type first semiconductor region and a second conductivity type second semiconductor region, and including a low-lifetime region that has a carrier lifetime shorter than that in other regions at the interface of the p-n junction, has the following characteristics. The method carries out an implantation process of, after implanting a second conductivity type impurity into the surface of the first semiconductor region with a first acceleration energy, implanting a second conductivity type impurity, with a second acceleration energy differing from the first acceleration energy, into the surface of the first semiconductor region into which the second conductivity type impurity has been implanted.

Also, a semiconductor device manufacturing method according to a fourteenth aspect of the invention is further characterized by, in the thirteenth aspect (for example), carrying out an activation process of partially activating the second conductivity type impurity implanted in the implantation process, thereby forming the second semiconductor region in the surface layer of the first semiconductor region, and forming the low-life time region activated in accordance with the second conductivity type impurity concentration distribution at the interface of the first semiconductor region and second semiconductor region.

Also, a semiconductor device manufacturing method according to a fifteenth aspect of the invention is characterized, in the fourteenth aspect (for example), in that in the activation process, the surface of the first semiconductor region into which the second conductivity type impurity has been implanted is irradiated with a laser having an irradiation energy density of $1.0 \times 10^{-3}$ J/cm$^2$ or more, $2.0 \times 10^{-3}$ J/cm$^2$ or less, and photon energy greater than 1.1 eV, partially activating the second conductivity type impurity.

Also, a semiconductor device manufacturing method according to a sixteenth aspect of the invention is characterized, in the fourteenth aspect (for example), in that in the activation process, the low-lifetime region is formed extending from the second semiconductor region to the first semiconductor region.

Also, a semiconductor device manufacturing method according to a seventeenth aspect of the invention is characterized, in the invention according to the sixteenth aspect (for example), in that in the activation process, the low-lifetime region is formed at a depth 0.4 μm or more, 1.2 μm or less, from the surface on the side opposite the plane in which the second semiconductor region is in contact with the first semiconductor region.

Also, a semiconductor device manufacturing method according to an eighteenth aspect of the invention is characterized, in the fourteenth aspect (for example), in that in the activation process, a region as far as a depth of 0.5 µm or more, 0.8 µm or less, from the surface of the first semiconductor region into which the second conductivity type impurity has been implanted is electrically activated, thereby forming the second semiconductor region.

Also, in order to solve the heretofore described problems, and achieve objects of the invention, a semiconductor device manufacturing method according to a nineteenth aspect of the invention for manufacturing a semiconductor device having a p-n junction formed of a first conductivity type fifth semiconductor region, provided in the surface layer of a first conductivity type first semiconductor region and having a resistivity lower than that of the first semiconductor region, and a second conductivity type second semiconductor region, and including a low-lifetime region that has a carrier lifetime shorter than that in other regions at the interface of the p-n junction, has the following characteristics. The method carries out an implantation process of, after implanting a second conductivity type impurity into the surface of the fifth semiconductor region with a first acceleration energy, implanting a second conductivity type impurity, with a second acceleration energy differing from the first acceleration energy, into the surface of the fifth semiconductor region into which the second conductivity type impurity has been implanted.

Also, a semiconductor device manufacturing method according to a twentieth aspect of the invention is characterized by, in the nineteenth aspect (for example), carrying out an activation process of partially activating the second conductivity type impurity implanted in the implantation process, thereby forming the second semiconductor region in the surface layer of the fifth semiconductor region, and forming the low-life time region activated in accordance with the second conductivity type impurity concentration distribution at the interface of the fifth semiconductor region and second semiconductor region.

Also, a semiconductor device manufacturing method according to a twenty-first aspect of the invention is characterized, in the twentieth aspect (for example), in that in the activation process, the surface of the fifth semiconductor region into which the second conductivity type impurity has been implanted is irradiated with a laser having an irradiation energy density of $1.0 \times 10^{-3}$ J/cm$^2$ or more, $2.0 \times 10^{-3}$ J/cm$^2$ or less, and photon energy greater than 1.1 eV, partially activating the second conductivity type impurity.

Also, a semiconductor device manufacturing method according to a twenty-second aspect of the invention is characterized, in the twentieth aspect (for example), in that in the activation process, the low-lifetime region is formed extending from the second semiconductor region to the fifth semiconductor region.

Also, a semiconductor device manufacturing method according to a twenty-third aspect of the invention is characterized, in the twenty-second aspect (for example), in that in the activation process, the low-lifetime region is formed at a depth 0.4 µm or more, 1.2 µm or less, from the surface on the side opposite the plane in which the second semiconductor region is in contact with the fifth semiconductor region.

Also, a semiconductor device manufacturing method according to a twenty-fourth aspect of the invention is characterized, in the twentieth aspect (for example), in that in the activation process, a region as far as a depth of 0.5 µm or more, 0.8 µm or less, from the surface of the fifth semiconductor region into which the second conductivity type impurity has been implanted is electrically activated, thereby forming the second semiconductor region.

Also, a semiconductor device manufacturing method according to a twenty-fifth aspect of the invention is characterized, in any one of the fourteenth through eighteenth and twentieth through twenty-fourth aspects (for example), in that in the activation process, the activation rate of the low-lifetime region is lower than the activation rate of the second semiconductor region.

Also, a semiconductor device manufacturing method according to a twenty-sixth aspect of the invention is characterized in that, in any one of the fourteenth through twenty-fourth aspects (for example), the first acceleration energy is 100 keV or more, 300 keV or less.

Also, a semiconductor device manufacturing method according to a twenty-seventh aspect of the invention is characterized in that, in any one of the fourteenth through twenty-fourth aspects (for example), the second acceleration energy is 30 keV or more, 60 keV or less.

Also, a semiconductor device manufacturing method according to a twenty-eighth aspect of the invention is characterized in that, in any one of the fourteenth through twenty-fourth aspects (for example), the dose of the second conductivity type impurity implanted with the first acceleration energy is $1.0 \times 10^{13}$ cm$^{-2}$ or more, $3.0 \times 10^{14}$ cm$^{-2}$ or less.

Also, a semiconductor device manufacturing method according to a twenty-ninth aspect of the invention is characterized in that, in any one of the fourteenth through twenty-fourth aspects (for example), the dose of the second conductivity type impurity implanted with the second acceleration energy is $1.0 \times 10^{13}$ cm$^{-2}$ or more, $3.0 \times 10^{14}$ cm$^{-2}$ or less.

Also, a semiconductor device manufacturing method according to a thirtieth aspect of the invention is characterized in that, in any one of the fourteenth through twenty-fourth aspects (for example), the second conductivity type impurity implanted with the first acceleration energy is boron.

Also, a semiconductor device manufacturing method according to a thirty-first aspect of the invention is characterized in that, in any one of the fourteenth through twenty-fourth aspects (for example), the second conductivity type impurity implanted with the second acceleration energy is boron.

According to the first through twelfth aspects, a low-lifetime region, partially activated in accordance with a second conductivity type impurity concentration distribution of the second semiconductor region, and having a carrier lifetime shorter than that in other regions, is provided at the interface between the first semiconductor region and second semiconductor region. That is, the low-lifetime region, having an activation rate lower than that of the second semiconductor region, is barely activated. Because of this, it is possible to suppress an implantation of minority carriers (holes) from the second semiconductor region to the first semiconductor region when turning on. Because of this, it is possible to reduce the on-state voltage $V_{on}$ when turning on. Meanwhile, when turning off, the low-lifetime region accelerates the recombination of electrons on the third electrode side of the second semiconductor region, thereby reducing the time for which a collector current flows. Because of this, it is possible to reduce the energy loss $E_{off}$ when turning off.

Also, according to the thirteenth through thirty-first aspects, by carrying out two ion implantations with differing acceleration energies in the implantation process, it is possible to form the second semiconductor region and low-lifetime region simultaneously. Because of this, it is not necessary to carry out an ion implantation process that is solely for forming the low-lifetime region. Also, it is possible for the dose of the ion implantation for forming the low-lifetime region to be lower than heretofore.

Also, by carrying out two ion implantations with differing acceleration energies in the implantation process, it is possible for the dose in the portion of the surface layer of the first semiconductor region in which the second semiconductor region is formed to be higher than heretofore.

Also, it is possible to form the low-lifetime region using a heretofore known ion implantation device. Because of this, there is no need for a special ion implantation device for forming the low-lifetime region. Because of this, it is possible to fabricate the semiconductor device of the invention on a general manufacturing line. Also, it is possible to form the low-lifetime region with one heat treatment. Because of this, it is possible to improve throughput.

Advantages

According to embodiments for the semiconductor device and semiconductor device manufacturing method, an advantage is obtained in that it is possible to improve the trade-off relationship between on-state voltage and energy loss. Also, an advantage is obtained in that it is possible to improve electrical characteristics. Also, an advantage is obtained in that it is possible to reduce manufacturing cost. Also, an advantage is obtained in that it is possible to efficiently fabricate the semiconductor device.

Additional aspects and/or advantages will be set forth in part in the description which follows and, in part, will be apparent from the description, or may be learned by practice of the invention.

BRIEF DESCRIPTION OF THE DRAWINGS

These and/or other aspects and advantages will become apparent and more readily appreciated from the following description of the embodiments, taken in conjunction with the accompanying drawings of which:

FIG. 2 is a sectional view showing a manufacturing process of the semiconductor device according to Embodiment 1.

FIG. 3 is a sectional view showing a manufacturing process of the semiconductor device according to Embodiment 1.

FIG. 8 is a sectional view showing a manufacturing process of the semiconductor device according to Embodiment 1.

FIG. 9 is a sectional view showing a manufacturing process of the semiconductor device according to Embodiment 1.

FIG. 12 is a sectional view showing a manufacturing process of the semiconductor device according to Embodiment 1.

FIG. 13 is a sectional view showing a manufacturing process of the semiconductor device according to Embodiment 1.

DETAILED DESCRIPTION OF EMBODIMENTS

Figure 1:
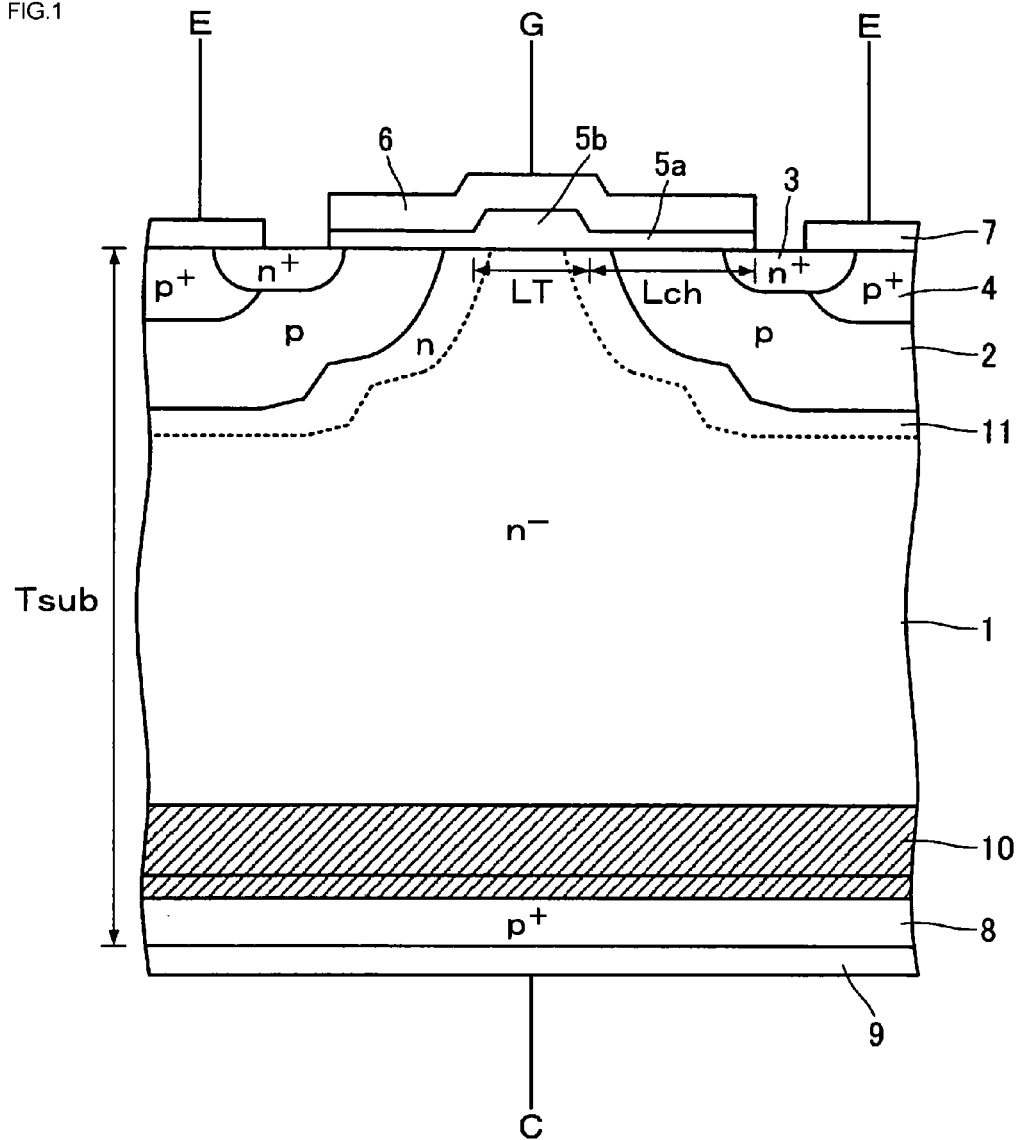
FIG. 1 is a sectional view showing a semiconductor device according to Embodiment 1.

Reference will now be made in detail to the embodiments, examples of which are illustrated in the accompanying drawings, wherein like reference numerals refer to the like elements throughout. The embodiments are described below to explain the invention by referring to the figures.

Hereafter, referring to the attached drawings, a detailed description will be given of preferred embodiments of a semiconductor device and semiconductor device manufacturing method according to embodiments of the invention. In this description and attached drawings, a layer or region being prefixed with n or p means that electrons or holes respectively are majority carriers. Also, + or − added to n or p indicates a higher impurity concentration or lower impurity concentration respectively than in a layer or region to which + or − is not added. In the following description of the embodiments and attached drawings, the same reference numerals and signs are given to identical configurations, and a redundant description is omitted.

Embodiment 1

FIG. 1 is a sectional view showing a semiconductor device according to Embodiment 1. The semiconductor device shown in FIG. 1 is an IGBT with a planar gate structure. An active region through which a drift current flows, and a termination structure portion (not shown) surrounding the active region, are provided in an n⁻ drift region (first semiconductor region) 1 formed of an n⁻-type (first conductivity type) wafer. It is preferable to use a wafer fabricated, for example with floating zone method (hereafter referred to as an FZ wafer. An eventual FZ wafer thickness Tsub after the completion of the IGBT may be 245 μm or more, 285 μm or less.

A p-type (second conductivity type) p-base region (third semiconductor region) 2 is selectively provided in a surface layer of the front surface of the wafer that forms the n⁻ drift region 1 (the front surface of the n⁻ drift region 1). Also, an n-region 11, which covers the p-base region 2 from the surface of the n⁻ drift region 1 to a region below the p-base region 2, is provided in the surface layer of the surface of the n⁻ drift region 1. The n-region 11 has a resistivity lower than that of the n⁻ drift region 1.

A gate insulating film (first insulating film) 5a is provided from the n⁻ drift region 1 across the surface of the p-base region 2. An oxide film region (second insulating film) 5b in contact with the gate insulating film 5a is provided on the surface of the n⁻ drift region 1. That is, the oxide film region 5b is provided between the gate insulating films 5a provided on the surfaces of neighboring p-base regions 2, in contact with the gate insulating films 5a. The oxide film region 5b is of a thickness greater than that of the gate insulating film 5a. A length (hereafter referred to as a first length) LT from the gate insulating film 5a side in contact with one end portion of the oxide film region 5b to the gate insulating film 5a in contact with the other end portion may be 23 μm. A length (hereafter referred to as a second length) Lch of the gate insulating film 5a in the same direction as the direction in which the first length LT is measured may be 9.5 μm. A gate electrode 6 (first electrode) is provided on the gate insulating film 5a and oxide film region 5b.

An n⁺ emitter region (fourth semiconductor region) 3 is selectively provided in a surface layer of the p-base region 2. The n⁺ emitter region 3 is self-aligned with an end portion of the gate electrode 6. Also, the n⁺ emitter region 3 is provided so as to extend as far as one portion of the region below the gate insulating film 5a. The n⁺ emitter region 3 has a resistivity lower than that of the n⁻ drift region 1. Also, a p⁺ contact region (sixth semiconductor region) 4 is selectively provided in the surface layer of the p-base region 2. The p⁺ contact region 4 has a resistivity lower than that of the p-base region 2. Also, the p⁺ contact region 4 is in contact with the n⁺ emitter region 3, and covers one portion of the region below the n⁺ emitter region 3.

An emitter electrode 7 is in contact with the n⁺ emitter region 3 and p⁺ contact region 4, short circuiting the n⁺ emitter region 3 and p⁺ contact region 4. Also, it is acceptable that no p⁺ contact region 4 is provided. In this case, the emitter electrode 7 is in contact with the p-base region 2 and n⁺ emitter region 3, short circuiting the p-base region 2 and n⁺ emitter region 3.

A p⁺ collector region (second semiconductor region) 8 is formed into the rear surface of the wafer, that is, the rear surface of the n⁻ drift region 1. The p⁺ collector region 8 forms a p-n junction with the n⁻ drift region 1. A collector electrode (third electrode) 9 is in contact with the p⁺ collector region 8.

A low-lifetime region 10, in which the carrier lifetime is shorter than in other regions, is provided at the interface between the n⁻ drift region 1 and p⁺ collector region 8. Specifically, the low-lifetime region 10 is provided extending from the p⁺ collector region 8 to the n⁻ drift region 1, including the interface between the n⁻ drift region 1 and p⁺ collector region 8. Also, the low-lifetime region 10 is partially activated in accordance with the concentration distribution of a p-type impurity (second conductivity type impurity) such as, for example, boron, implanted to form the p⁺ collector region 8. Being partially activated means that, as there is a portion that is not activated, the activation rate does not reach 100%. Specifically, the low-lifetime region 10, having a lower activation rate than that of the p⁺ collector region 8, is barely activated, with an activation rate of, for example, 10% or less. That is, the low-lifetime region 10 is a region in which exists a p-type impurity, implanted to form the p⁺ collector region 8, which exists on the n⁻ drift region 1 side and p⁺ collector region 8 side from the interface between the n⁻ drift region 1 and p⁺ collector region 8, and which is not activated.

It is preferable that a depth of, for example, 0.4 μm or more to 1.2 μm or less from the surface layer on the side on which the p⁺ collector region 8 is in contact with the collector electrode 9 is taken to be the low-lifetime region 10. It is preferable that the p⁺ collector region 8 is completely electrically activated to a depth of, for example, 0.5 μm or more, 0.8 μm or less, from the surface on the collector electrode 9 side. Further, it is preferable that a portion deeper than, for example, 0.5 μm or more, 0.8 μm or less, from the surface of the p⁺ collector region 8 on the collector electrode 9 side is taken to be the low-lifetime region 10.

FIGS. 2 to 15 are sectional views showing a manufacturing process for the semiconductor device according to Embodiment 1. For example, a description will be given of a method of fabricating a planar gate structure IGBT having a breakdown voltage of 1,700V. Herein, the drawings show the front surface of the wafer facing upward, but it is assumed that the surfaces of the semiconductor wafer are reversed as appropriate at each step or process (hereafter, the same also applies to FIGS. 16 to 20). Firstly, an n⁻-type FZ wafer that is to form the n⁻ drift region 1 is prepared. The resistivity of the FZ wafer may be, for example, 80 Ω/cm or more, 120 Ω/cm or less. Next, a floating p-region (not shown) is formed in the surface layer of the front surface of the n⁻ drift region 1 in the region in which the termination structure is formed, using ion implantation and thermal diffusion treatment (refer to FIG. 35). Next, an oxide film (not shown) formed on the front surface of the n⁻ drift region 1 in the active region by the formation of the floating p-region is removed. Hereafter, a description will be given of each region formed in the active region.

Next, a thermal oxide film that is to form the oxide film region 5b is grown on the front surface of the n⁻ drift region 1, as shown in FIG. 2. The thickness of the thermal oxide film may be, for example, 700 nm or more, 1,000 nm or less. Next, using photolithography, a resist mask 21, opened in such a way that one portion of the thermal oxide film is exposed, is formed on the surface of the thermal oxide film that is to form the oxide film region 5b. Next, etching is carried out with the resist mask 21, removing the thermal oxide film exposed in the aperture portion of the resist mask 21. By so doing, the oxide film region 5b is formed on the front surface of the n⁻ drift region 1. Then, the resist mask 21 is removed, and the FZ wafer is cleaned. Herein, wet etching may be used, or dry etching may be used, as the etching method (hereafter, the same applies in the process of etching the thermal oxide film).

Next, a screen oxide film 22 is grown on the front surface side of the n⁻ drift region 1, as shown in FIG. 3. Next, for example, phosphorus (P) ions are implanted from above the screen oxide film 22 into the front surface of the n⁻ drift region 1. Herein, the acceleration energy of the ion implantation may be, for example, 100 keV, and the dose may be $1.0 \times 10^{12}$ cm$^{-2}$ or more, $1.5 \times 10^{12}$ cm$^{-2}$ or less. By so doing, an impurity region that is to form the n-region 11 is formed in a portion of the surface layer of the front surface of the n⁻ drift region 1 on whose surface the oxide film region 5b is not formed.

Figure 4:
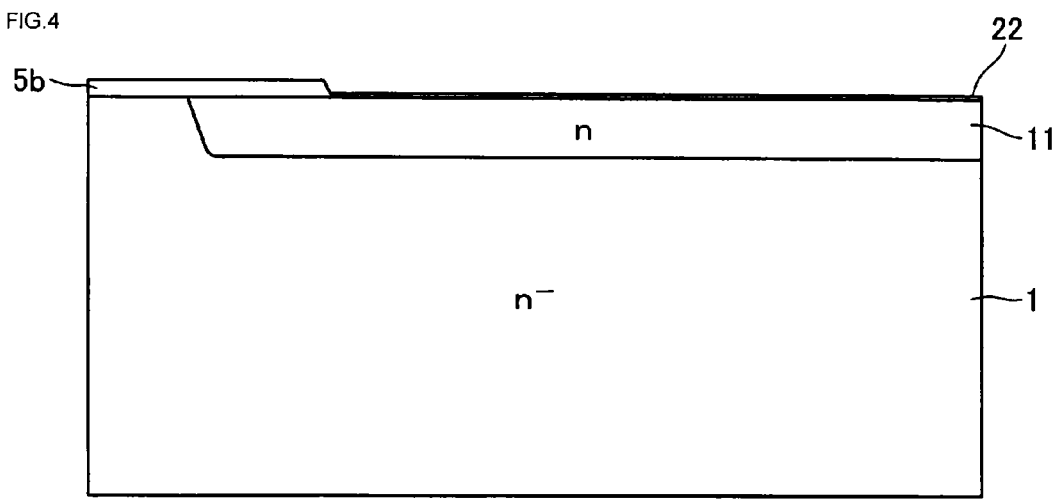
FIG. 4 is a sectional view showing a manufacturing process of the semiconductor device according to Embodiment 1.
Figure 5:
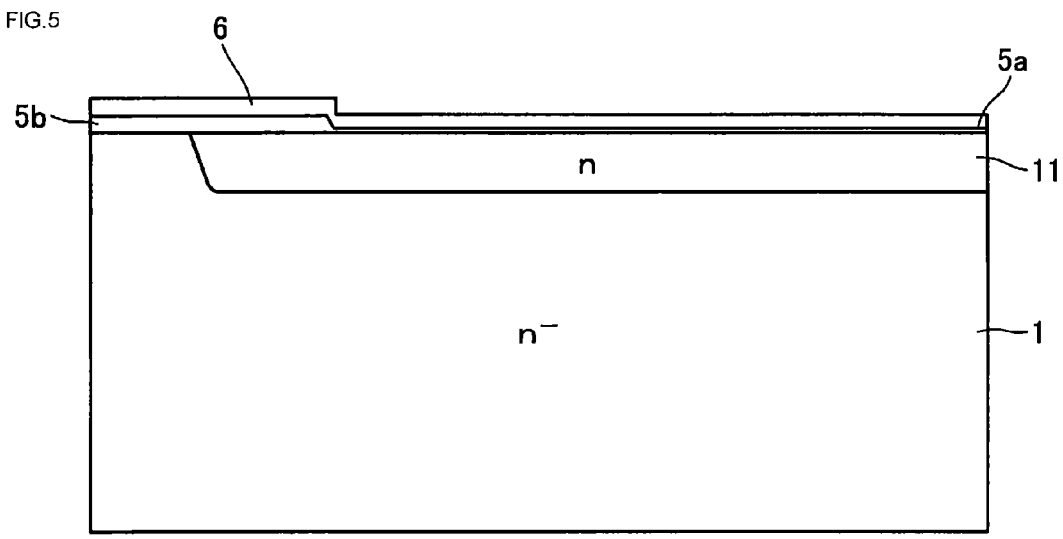
FIG. 5 is a sectional view showing a manufacturing process of the semiconductor device according to Embodiment 1.

Next, the impurity region that is to form the n-region 11 is diffused using thermal diffusion treatment. For example, thermal diffusion treatment may be carried out for five hours at 1,150° C. in an inert gas atmosphere. By so doing, the n-region 11 is formed, as shown in FIG. 4. Next, using wet etching, the oxide film is removed until the silicon of the FZ wafer surface is exposed, as shown in FIG. 5. By so doing, the screen oxide film 22 is removed. Next, the gate insulating film 5a is grown on the front side of the wafer. By so doing, the gate insulating film 5a is in contact with the oxide film region 5b. Next, an n-type polysilicon layer with low resistivity, which is to form the gate electrode 6, is deposited over the whole surface on the front surface side of the n⁻ drift region 1. Herein, the thickness of the polysilicon layer may be, for example, 0.4 μm or more, 0.8 μm or less.

Figure 6:
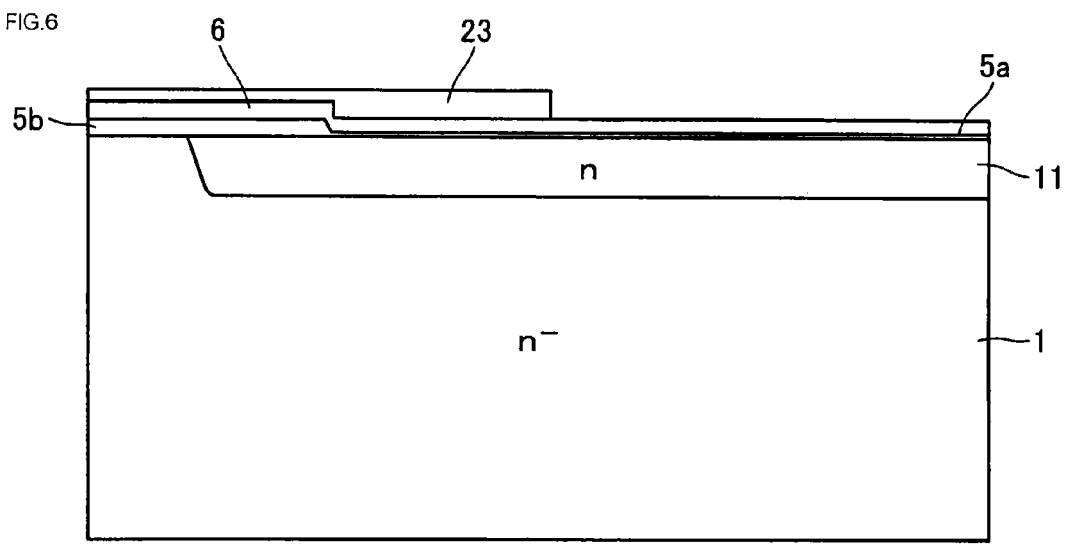
FIG. 6 is a sectional view showing a manufacturing process of the semiconductor device according to Embodiment 1.

Next, using photolithography, a resist mask 23, opened in such a way that one portion of the polysilicon layer is exposed, is formed on the surface of the polysilicon layer that is to form the gate electrode 6, as shown in FIG. 6. Next, isotropic etching or anisotropic etching is carried out with the resist mask 23 as a mask, removing the polysilicon layer exposed in the aperture portion of the resist mask 23. By so doing, the gate electrode 6 is formed across the gate insulating film 5a and oxide film region 5b on the front surface of the n⁻ drift region 1. Then, the resist mask 23 is removed, and the FZ wafer is cleaned.

Figure 7:
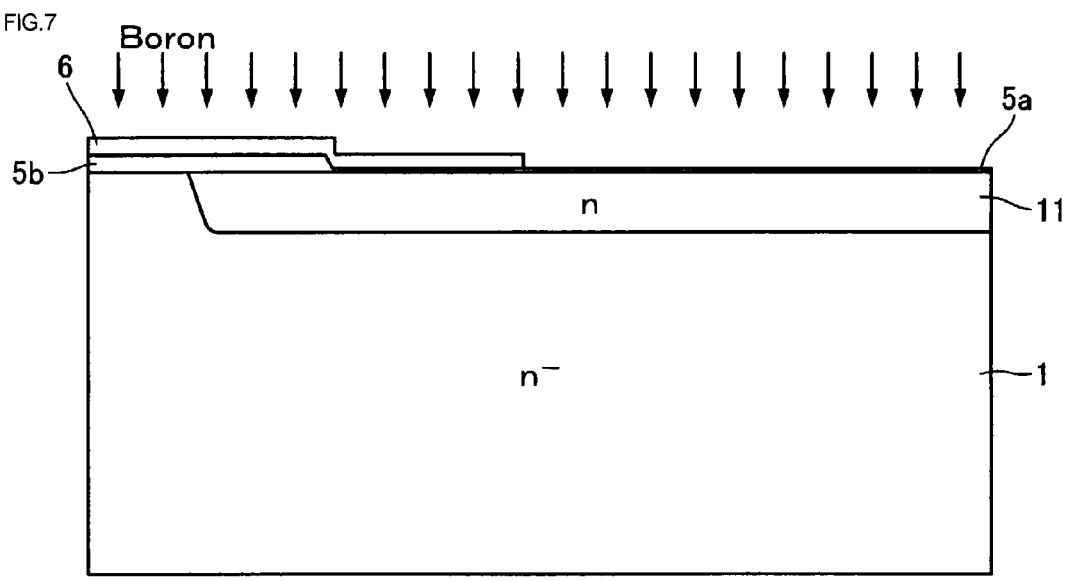
FIG. 7 is a sectional view showing a manufacturing process of the semiconductor device according to Embodiment 1.

Next, for example, boron (B) ions are implanted into the front surface of the n⁻ drift region 1 from a direction perpendicular to the surface of the FZ wafer, with the gate electrode 6 as a mask, in such a way that the ions self-align with the gate electrode 6, as shown in FIG. 7. Herein, the acceleration energy of the ion implantation may be, for example, 45 keV, and the dose may be in the region of $1.0 \times 10^{14}$ cm$^{-2}$. By so doing, an impurity region (not shown) that forms the p-base region 2 is formed, self-aligned with an end portion of the gate electrode 6, in the surface layer of the n-region 11. Then, the FZ wafer is cleaned.

Next, the p-base region 2 is diffused using thermal diffusion, as shown in FIG. 8. For example, thermal diffusion treatment may be carried out for two hours at 1,150° C. in an inert gas atmosphere. Next, using photolithography, a resist mask 24, in which is opened a region in which the p⁺ contact region 4 is to be formed, is formed on the front surface side of the n⁻ drift region 1, as shown in FIG. 9. Next, for example, boron ions are implanted from above the gate insulating film 5a into the front surface of the n⁻ drift region 1. Herein, the acceleration energy of the ion implantation may be, for example, 150 keV, and the dose may be in the region of $2.0 \times 10^{15}$ cm$^{-2}$. By so doing, an impurity region (not shown) that forms the p⁺ contact region 4 is formed in the surface layer of the p-base region 2. Then, the resist mask 24 is removed, and the FZ wafer is cleaned.

Figure 10:
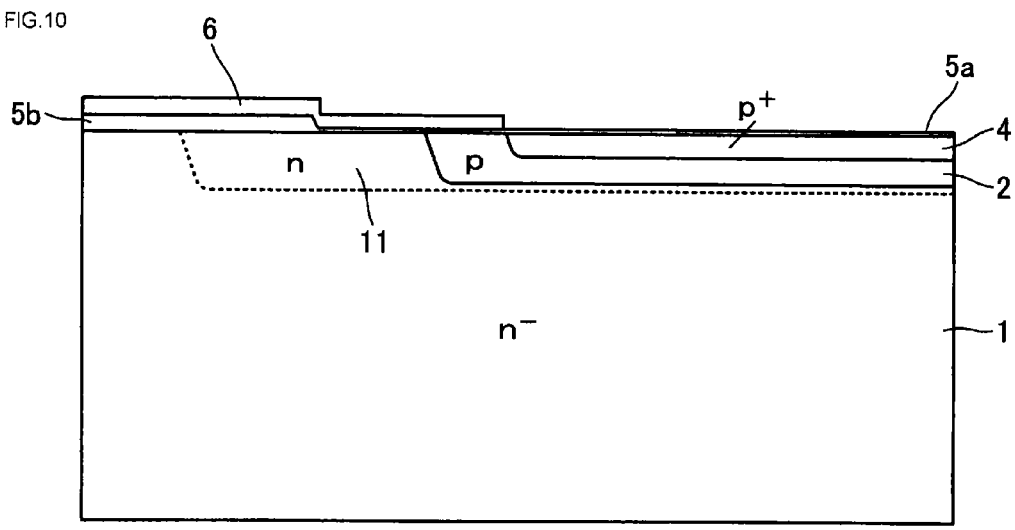
FIG. 10 is a sectional view showing a manufacturing process of the semiconductor device according to Embodiment 1.
Figure 11:
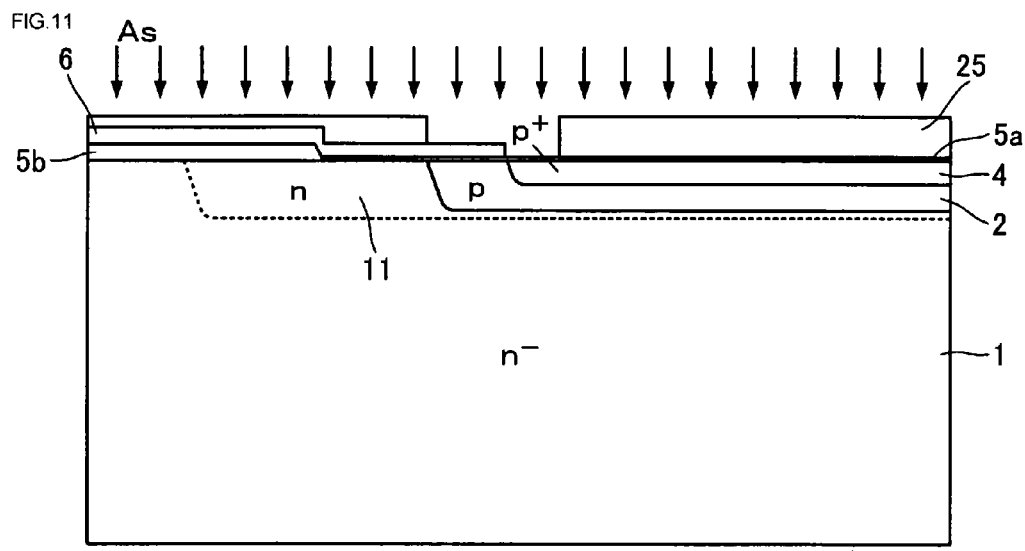
FIG. 11 is a sectional view showing a manufacturing process of the semiconductor device according to Embodiment 1.

Next, using thermal diffusion, the impurity region that forms the p⁺ contact region 4 is diffused. By so doing, the p⁺ contact region 4 is formed, as shown in FIG. 10. Next, using photolithography, a resist mask 25, in which is opened a region in which the n⁺ emitter region 3 is to be formed, is formed on the front surface side of the n⁻ drift region 1, as shown in FIG. 11. Next, for example, arsenic (As) ions are implanted from above the gate insulating film 5a into the front surface of the n⁻ drift region 1. Herein, the acceleration energy of the ion implantation may be, for example, 120 keV, and the dose may be in the region of $1.0 \times 10^{15}$ cm$^{-2}$. By so doing, an impurity region (not shown) that forms the n⁺ emitter region 3 is formed in the surface layers of the p-base region 2 and p⁺ contact region 4. Then, the resist mask 25 is removed, and the FZ wafer is cleaned.

Next, using thermal diffusion, the impurity region that forms the n⁺ emitter region 3 is diffused. By so doing, the n⁺ emitter region 3 is formed, as shown in FIG. 12. Next, a compound film 12 of an HTO (High Temperature Oxide) film and interlayer insulating film (BPSG: Boron Phosphor Silicate Glass) is deposited on the front surface side of the n⁻ drift region 1. The thickness of the HTO film may be, for example, 200 nm. The thickness of the interlayer insulating film may be, for example, 1 μm. Hereafter, the compound film 12 formed of the HTO film and interlayer insulating film will be referred to simply as the interlayer insulating film 12. Next, heat treatment is performed on the interlayer insulating film 12 in an inert gas atmosphere.

Next, using photolithography, a resist mask 26, in which is opened a portion that is to come in contact with the emitter electrode 7, is formed on the front surface side of the n⁻ drift region 1. Next, with the resist mask 26 as a mask, anisotropic etching, or a combination of isotropic etching and anisotropic etching, is carried out, removing the interlayer insulating film 12 and gate insulating film 5a exposed in the aperture portion of the resist mask 26, and exposing the surface of the FZ wafer. By so doing, the n⁺ emitter region 3 and p⁺ contact region 4 are exposed. Then, the resist mask 26 is removed, and the FZ wafer is cleaned.

Next, using sputtering, an aluminum (Al) film that is to form the emitter electrode 7 is deposited on the front surface side of the n⁻ drift region 1, as shown in FIG. 13. Next, although omitted from the drawings, wet etching or dry etching is carried out, with a resist mask formed using photolithography as a mask, thereby patterning the emitter electrode 7. By so doing, the emitter electrode 7 is formed. Then, the resist mask is removed, and the FZ wafer is cleaned.

Next, although omitted from the drawings, a silicon nitride (SiN) film or polyimide film is deposited on the front side of the wafer. Etching is carried out, with a resist mask formed using photolithography, thereby patterning the film deposited on the emitter electrode 7, and exposing one portion of the emitter electrode 7. By so doing, a pad region for connecting the emitter electrode 7 and, for example, an external device is formed. Then, the resist mask is removed, and the FZ wafer is cleaned.

Figure 14:
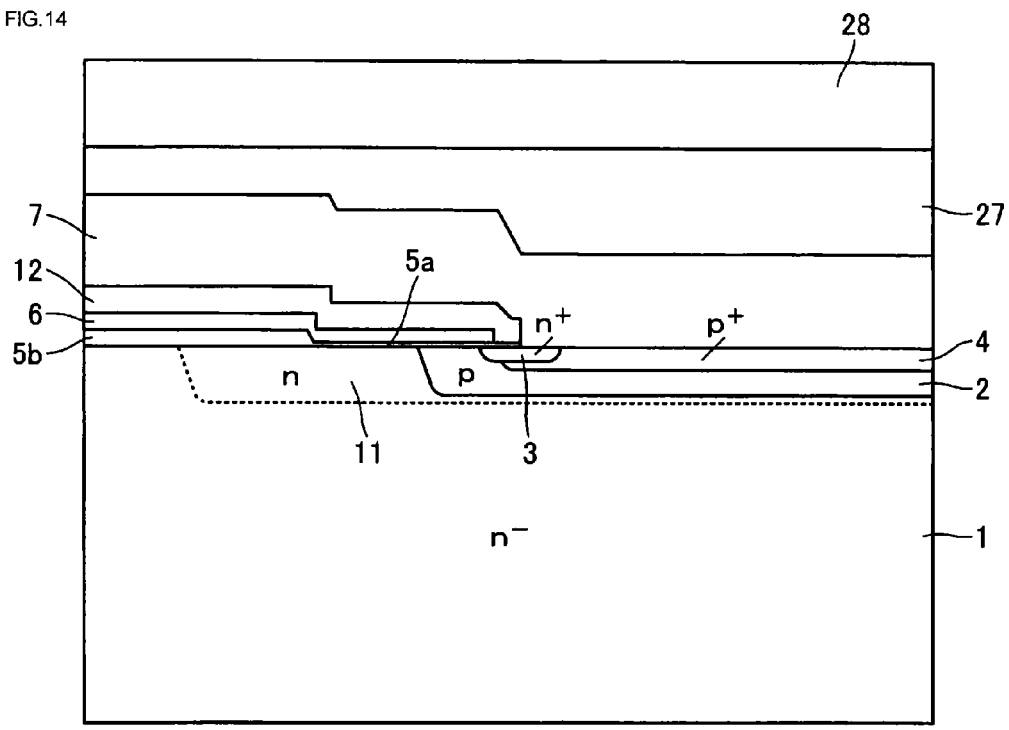
FIG. 14 is a sectional view showing a manufacturing process of the semiconductor device according to Embodiment 1.

Next, as shown in FIG. 14, a resist (hereafter referred to as a protective resist) 27, which protects the FZ wafer surface structure, is applied to the front side of the wafer, and hardened. Next, a tape (hereafter referred to as a BG tape) 28, which protects the wafer when back grinding (BG), is attached onto the protective resist 27. Next, the n$^-$ drift region 1 is ground from the rear surface side of the n$^-$ drift region 1, thinning the FZ wafer. Then, the BG tape 28 is removed, and the FZ wafer is cleaned. Next, in order to remove damage occurring on the rear surface of the n$^-$ drift region 1 due to the grinding, and to alleviate stress applied to the FZ wafer, the whole of the rear surface of the n$^-$ drift region 1 is uniformly removed by etching, thereby thinning the FZ wafer further by 5 μm or more, 20 μm or less.

Figure 15:
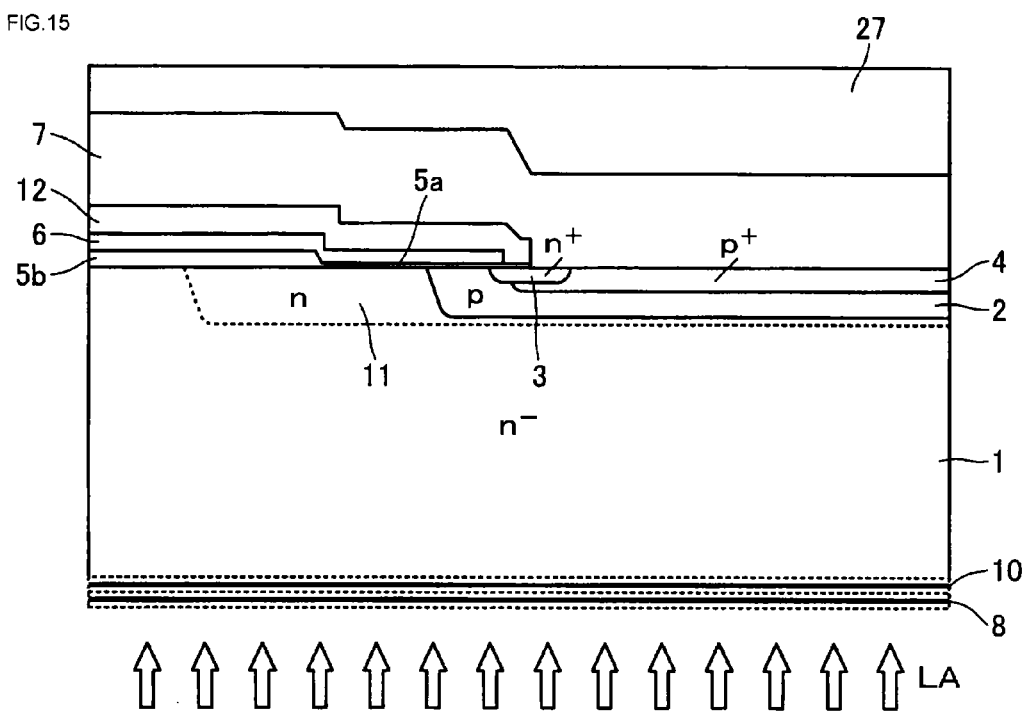
FIG. 15 is a sectional view showing a manufacturing process of the semiconductor device according to Embodiment 1.

Next, as shown in FIG. 15, a p-type impurity ion (second conductivity type impurity) implantation is carried out twice, with differing acceleration energies, into the whole of the rear surface of the n$^-$ drift region 1 (an implantation process). Specifically, after the p-type impurity ions are implanted with a first acceleration energy into the whole of the rear surface of the n$^-$ drift region 1, the p-type impurity ions are implanted again, with a second acceleration energy, into the whole of the rear surface of the n$^-$ drift region 1 into which the p-type impurity ions have been implanted. It is preferable that boron ions are used as the p-type impurity ions. The reason for this will be described hereafter. The second acceleration energy is lower than the first acceleration energy. For example, for the first ion implantation, the first acceleration energy may be, for example, 100 keV or more, 300 keV or less, and the dose may be $1.0 \times 10^{13}$ cm$^{-2}$ or more, $3.0 \times 10^{14}$ cm$^{-2}$ or less. For the second ion implantation, the second acceleration energy may be, for example, 30 keV or more, 60 keV or less, and the dose may be $1.0 \times 10^{13}$ cm$^{-2}$ or more, $3.0 \times 10^{14}$ cm$^{-2}$ or less. The first ion implantation and second ion implantation may be carried out with the same dose, or may be carried out with differing doses, and the order may be reversed.

Next, using heat treatment, the p-type impurity introduced into the rear surface of the n$^-$ drift region 1 is electrically activated, thereby forming the p$^+$ collector region 8 in the surface layer of the rear surface of the n$^-$ drift region 1, and forming the low-lifetime region 10 at the interface between the n$^-$ drift region 1 and p$^+$ collector region 8 (an activation process). That is, a portion (a portion of the region that forms the p$^+$ collector region 8 near the FZ wafer surface) from the surface to the above-mentioned depths in the surface layer of the rear surface of the n$^-$ drift region 1 into which the p-type impurity ions have been implanted is completely electrically activated, while a deeper portion (the region that is to form the low-lifetime region 10) is partially non-activated. The depth of the completely electrically activated portion of the p$^+$ collector region 8 is as stated above.

In the activation process, the low-lifetime region 10 becomes a region that is partially activated in accordance with the concentration distribution of the p-type impurity implanted in the implantation process. Because of this, the activation rate of the low-lifetime region 10 is lower than the activation rate of the p$^+$ collector region 8. Depending on the completely activated p$^+$ collector region 8 and partially activated low-lifetime region 10, it is good that the total activation rate of the p$^+$ collector region 8 and low-lifetime region 10 is in the region of 52% or more, 55% or less. That is, the activation rate of the p-type impurity ion implanted twice into the surface layer of the rear surface of the n$^-$ drift region 1 is in the region of 52% or more, 55% or less.

Specifically, the activation rate of the low-lifetime region 10 may be in the region of 90% in a portion near the FZ wafer surface, but it is desirable that the activation rate is 10% or less in the low-lifetime region 10 as a whole. That is, it is preferable that the activation rate of the portion deeper from the FZ wafer surface, including the low-lifetime region 10, is 10% or less. More specifically, it is preferable that the activation rate of the portion including the low-lifetime region 10, and deeper than 0.75 μm from the FZ wafer surface, is, for example, 10% or less.

In detail, in the activation process, for example, the rear surface of the n$^-$ drift region 1 into which boron ions have been implanted is irradiated with a laser, thereby electrically activating the boron introduced into the rear surface of the n$^-$ drift region 1. At this time, a laser having an irradiation energy density of $1.0 \times 10^{-3}$ J/cm$^2$ or more, $2.0 \times 10^{-3}$ J/cm$^2$ or less, and photo energy greater than 1.1 eV, may be used. Also, a YAG laser with a wavelength of 532 nm may be used. Preferably, it is good to use a laser having an irradiation energy density lower than a critical irradiation energy density at which silicon dissolves. Also, an annealing of the FZ wafer may be carried out for one hour at 380° C. in, for example, an annealing furnace, thereby electrically activating the boron introduced into the rear surface of the n$^-$ drift region 1.

When carrying out the activation process using an annealing furnace, the activation rate of the portion deeper from the FZ wafer surface, including the low-lifetime region 10, can be, for example, 1% or more, 6% or less. When carrying out the activation process using a laser, the activation rate is higher than when carrying out the activation process using an annealing furnace, meaning that it is possible to reduce a leakage current from the p-n junction between the n$^-$ drift region 1 and p$^+$ collector region 8.

Then, the protective resist 27 protecting the surface structure on the front surface side of the n$^-$ drift region 1 is removed, and the FZ wafer is cleaned. Next, an electrode material that is to form the collector electrode 9 is deposited on the surface of the p$^+$ collector region 8. Next, heat treatment is performed on the electrode material in an inert gas atmosphere. The heat treatment temperature may be, for example, 280° C. or more, 330° C. or less. In this way, the collector electrode 9 is formed. As the heat treatment temperature in the heat treatment for forming the collector electrode 9 is lower than in the activation process, it does not happen that the activation rate of the low-lifetime region 10 fluctuates.

In this way, the collector electrode 9 in contact with the p$^+$ collector region 8 is formed on the rear surface side of the n$^-$ drift region 1, thereby completing the semiconductor device shown in FIG. 1.

In the heretofore described processes, a processing whereby the rear surface of the n$^-$ drift region 1 is irradiated with, for example, accelerated electrons, or light ions such as protons, may be carried out in order to adjust the lifetime. In this case, it is sufficient that the irradiation is performed after the surface structure of the front surface of the IGBT is completed (refer to FIG. 13), and before carrying out the collector implantation process.

As heretofore described, according to Embodiment 1, the low-lifetime region 10, which is partially activated in accordance with the concentration distribution of the p-type impurity, is provided at the interface between the n$^-$ drift region 1 and p$^+$ collector region 8. That is, the low-lifetime region 10, having an activation rate lower than that of the p⁺ collector region 8, is barely activated. Because of this, it is possible to suppress an implantation of minority carriers (holes) from the p⁺ collector region 8 to the n⁻ drift region 1 when turning on. Because of this, it is possible to reduce an on-state voltage $V_{on}$. Meanwhile, when turning off, the low-lifetime region 10 accelerates the recombination of electrons on the collector electrode 9 side of the p⁺ collector region 8, thereby reducing the time for which a collector current flows. Because of this, it is possible to reduce an energy loss $E_{off}$. Consequently, it is possible to improve the trade-off relationship between the on-state voltage $V_{on}$ and energy loss $E_{off}$.

Also, by carrying out two ion implantations with differing acceleration energies in the implantation process, it is possible to form the p⁺ collector region 8 and low-lifetime region 10 simultaneously. Because of this, it is not necessary to carry out an ion implantation process that is solely for forming the low-lifetime region 10. Also, it is possible for the dose of the ion implantation for forming the low-lifetime region 10 to be lower than heretofore. Consequently, it is possible to reduce the manufacturing cost.

Also, by carrying out two ion implantations with differing acceleration energies in the implantation process, it is possible for the dose in the portion of the surface layer of the n⁻ drift region 1 in which the p⁺ collector region 8 is formed to be higher than heretofore. Because of this, it is possible to improve the electrical characteristics of the semiconductor device.

Also, it is possible to form the low-lifetime region 10 using a heretofore known ion implantation device. Because of this, there is no need for a special ion implantation device for forming the low-lifetime region 10. Because of this, it is possible to fabricate the IGBT of embodiments of the invention on a general manufacturing line. Also, it is possible to form the low-lifetime region 10 with one heat treatment (the activation process). Because of this, it is possible to improve throughput. By so doing, it is possible to fabricate the semiconductor device efficiently.

Embodiment 2

In the semiconductor device according to Embodiment 2, the IGBT according to Embodiment 1 may be a reverse blocking IGBT.

Figure 35:
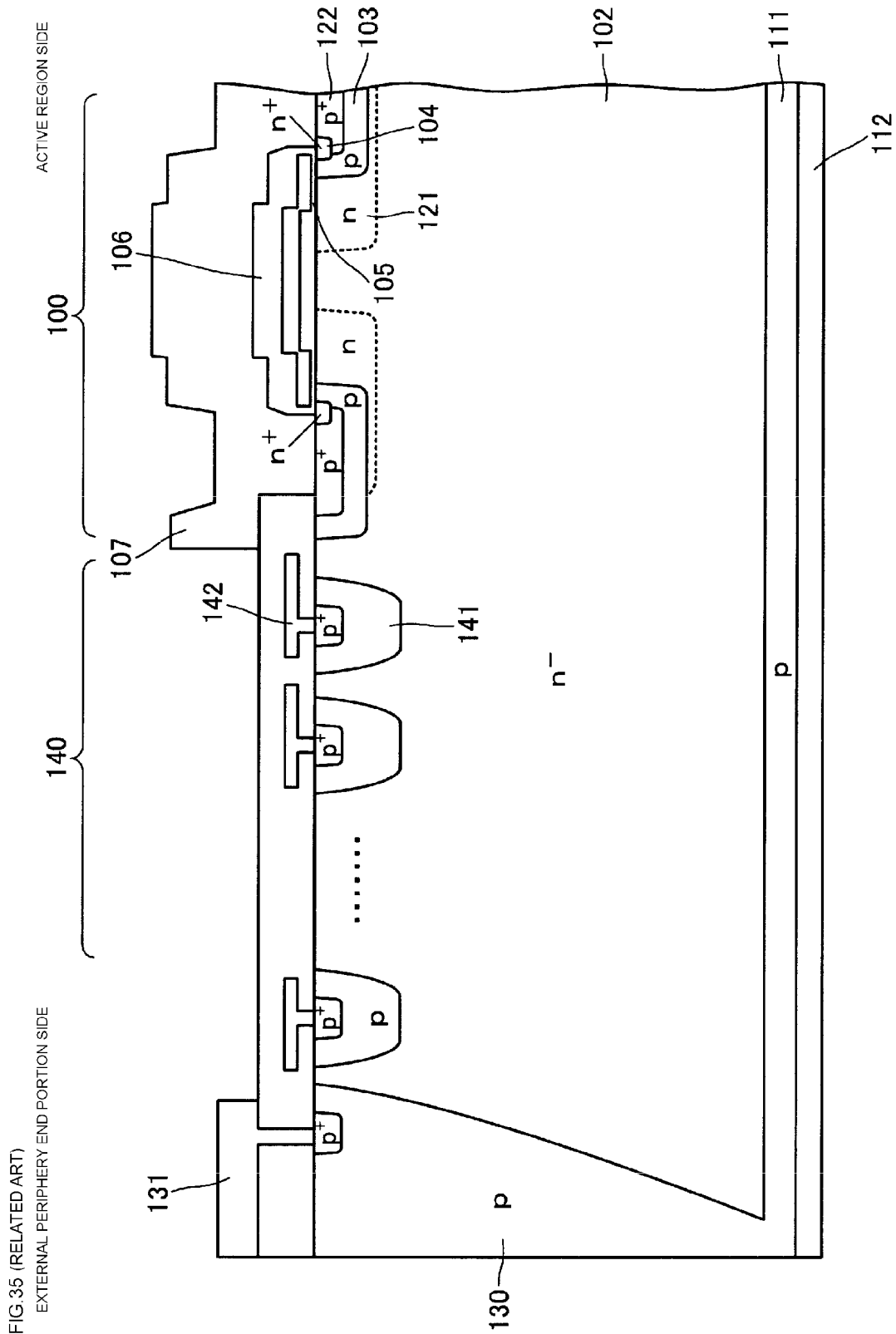
FIG. 35 is a sectional view showing a heretofore known reverse blocking IGBT.
Figure 36:
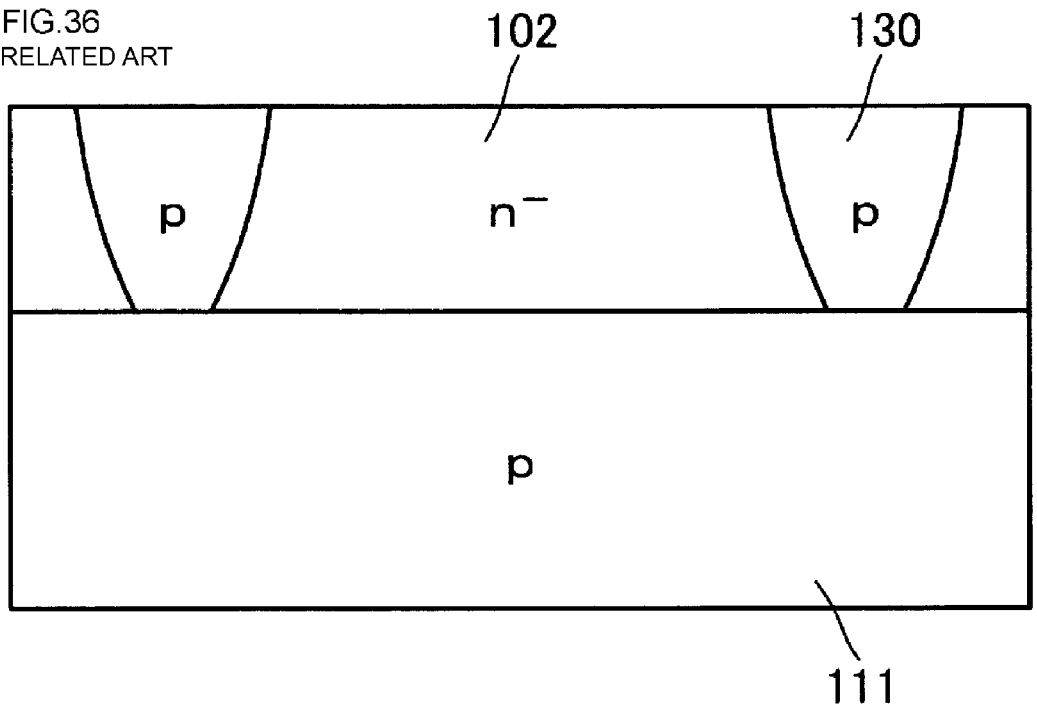
FIG. 36 is a sectional view showing the manufacturing process of a heretofore known reverse blocking IGBT.
Figure 37:
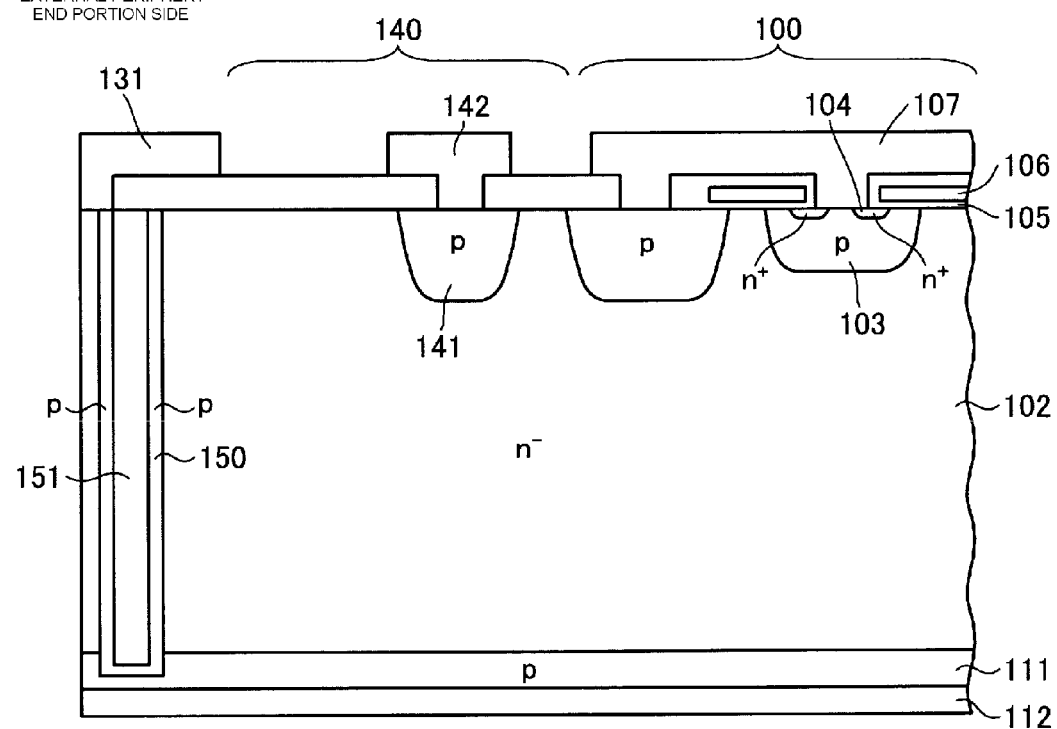
FIG. 37 is a sectional view showing a heretofore known reverse blocking IGBT.

In Embodiment 2, a p-type through-silicon isolation region (not shown), which penetrates through the n⁻ drift region 1 from the front surface of the n⁻ drift region 1, reaching the p⁺ collector region 8, is provided in an outer peripheral end portion of the n⁻ drift region 1 (refer to FIGS. 35 to 37). That is, the isolation region and termination structure are provided so as to surround the active region. Other configurations are the same as in Embodiment 1.

A description will be given of a method (hereafter referred to as a first manufacturing method) of manufacturing this kind of reverse blocking IGBT. For example, before starting the IGBT manufacturing processes shown in Embodiment 1, a p-type impurity such as, for example, boron (B) ions is selectively implanted into the front surface of the n⁻ drift region 1, thereby forming a p-impurity region. Next, the p-impurity region is diffused at high temperature for a long time until the p-impurity region reaches the rear surface of the n⁻ drift region 1. By so doing, a p⁺-type isolation region is formed from the front surface as far as the rear surface in the outer peripheral end portion of the n⁻ drift region 1. Subsequently, the IGBT manufacturing processes are carried out sequentially, in the same way as in Embodiment 1 (refer to FIGS. 2 to 15). At the same time, a termination structure formed of the p⁺ region and a field plate electrode is formed on the front surface side of the n⁻ drift region 1. In this way, the reverse blocking IGBT is completed.

Figure 38:
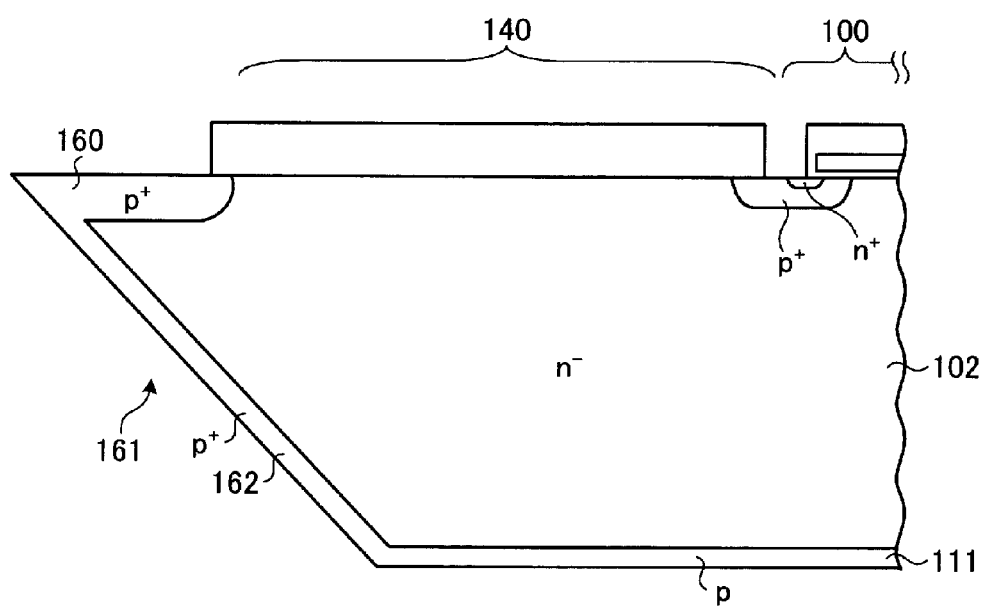
FIG. 38 is a sectional view showing another example of a heretofore known reverse blocking IGBT.

Also, a description will be given of a method (hereafter referred to as a second manufacturing method) of manufacturing a reverse blocking IGBT wherein the outer peripheral end portion is thinner than the active region side (refer to FIG. 38). Firstly, the p⁺-type isolation region and IGBT front surface structure are formed on the front surface of the n⁻ drift region 1, in the same way as with the first manufacturing method (refer to FIGS. 2 to 13). Next, the n⁻ drift region 1 is thinned to a predetermined thickness from the rear surface side of the n⁻ drift region 1, in the same way as in Embodiment 1 (FIG. 14). Next, a depressed portion is formed, penetrating the n⁻ drift region 1 from the rear surface of the n⁻ drift region 1, and reaching the front surface. Herein, the side walls of the depressed portion may form an angle of, for example, 54.7° with the rear surface of the n⁻ drift region 1. Next, the p⁺ collector region 8 and low-lifetime region 10 are formed in the rear surface of the n⁻ drift region 1, in the same way as in Embodiment 1 (refer to FIG. 15). At the same time, a p⁺ region is formed in the side walls of the depressed portion. Because of this, an isolation region connected to the p⁺ collector region 8 across the p⁺ region is formed. Next, the collector electrode 9, which is in contact with the p⁺ collector region 8, is formed (refer to FIG. 1). By so doing, the reverse blocking IGBT wherein the outer peripheral end portion is thinner than the active region side is completed.

Also, the heretofore described first and second manufacturing methods may be combined. That is, firstly, a p⁺-type isolation region is formed in the front surface of the n⁻ drift region 1, in the same way as with the first manufacturing method. Herein, the isolation region is formed from the front surface of the n⁻ drift region 1 in such a way as not to reach the rear surface. Next, the reverse blocking IGBT front surface surface structure is formed on the front surface of the n⁻ drift region 1, in the same way as in Embodiment 1 (refer to FIGS. 2 to 13). Next, the n⁻ drift region 1 is thinned to a predetermined thickness from the rear surface side of the n⁻ drift region 1, in the same way as in Embodiment 1 (FIG. 14). Next, a depressed portion is formed on the rear surface side of the n⁻ drift region 1, in the same way as with the second manufacturing method. Herein, the depressed portion is formed to a depth reaching the isolation region, without penetrating the n⁻ drift region 1. Next, the p⁺ collector region 8, p⁺ region, and collector electrode 9 are formed in the rear surface of the n⁻ drift region 1, in the same way as with the second manufacturing method, thereby completing the reverse blocking IGBT.

As heretofore described, according to Embodiment 2, it is possible to obtain the same advantages as in Embodiment 1.

Embodiment 3

In the semiconductor device according to Embodiment 3, the IGBT according to Embodiment 1 may be an IGBT with a trench gate structure.

Figure 27:
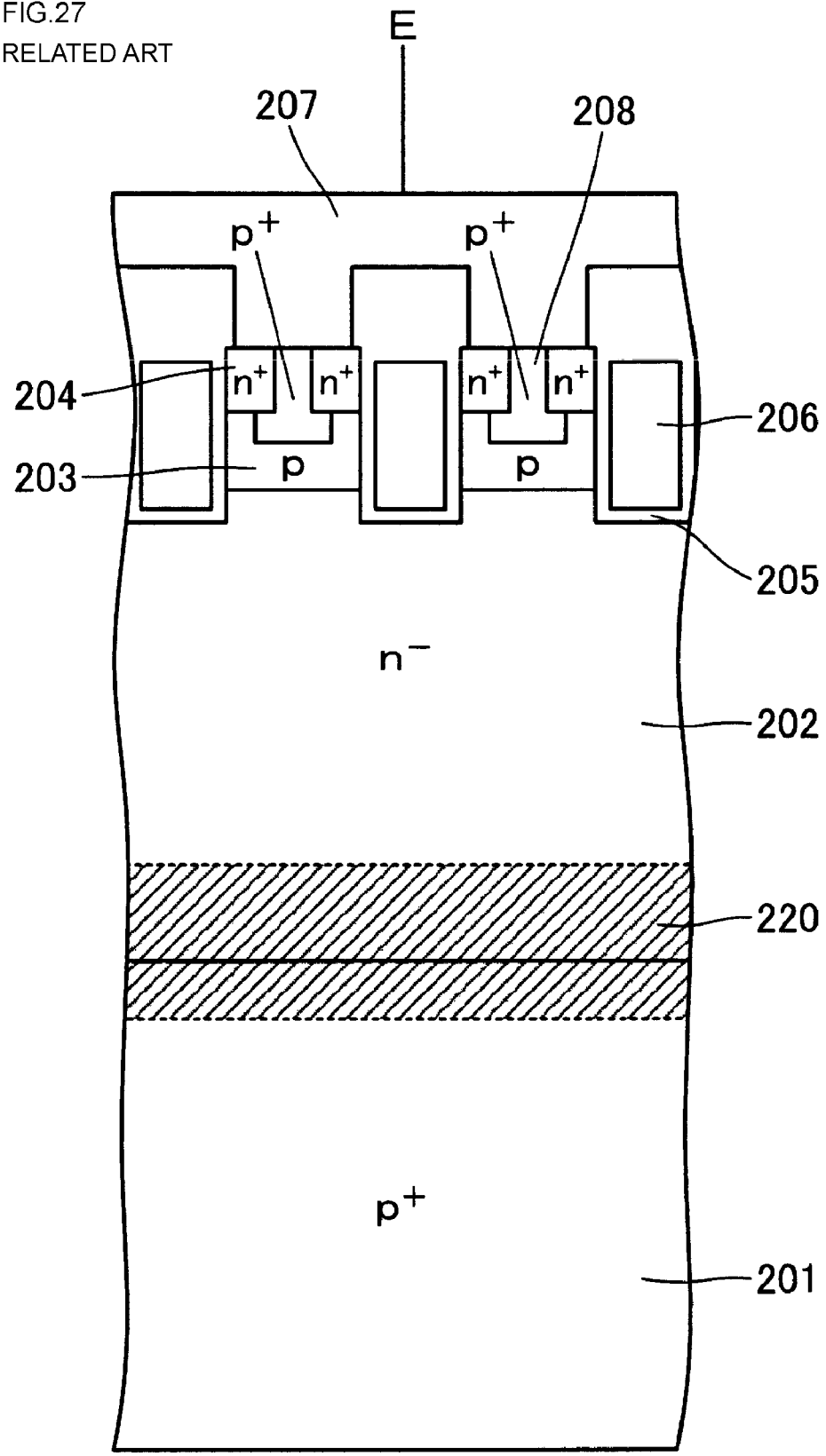
FIG. 27 is a sectional view showing another example of a heretofore known IGBT.
Figure 28:
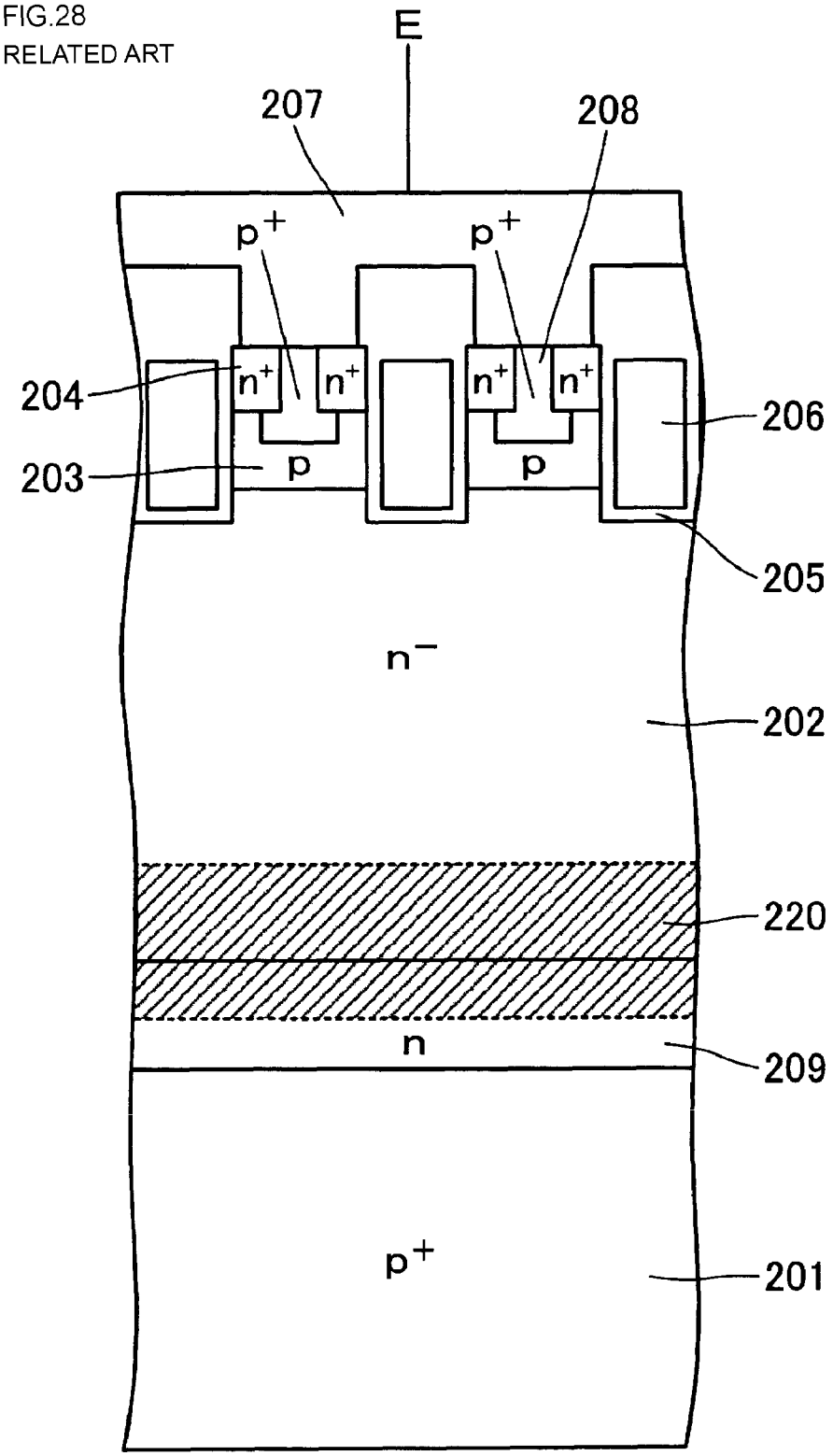
FIG. 28 is a sectional view showing another example of a heretofore known IGBT.
Figure 29:
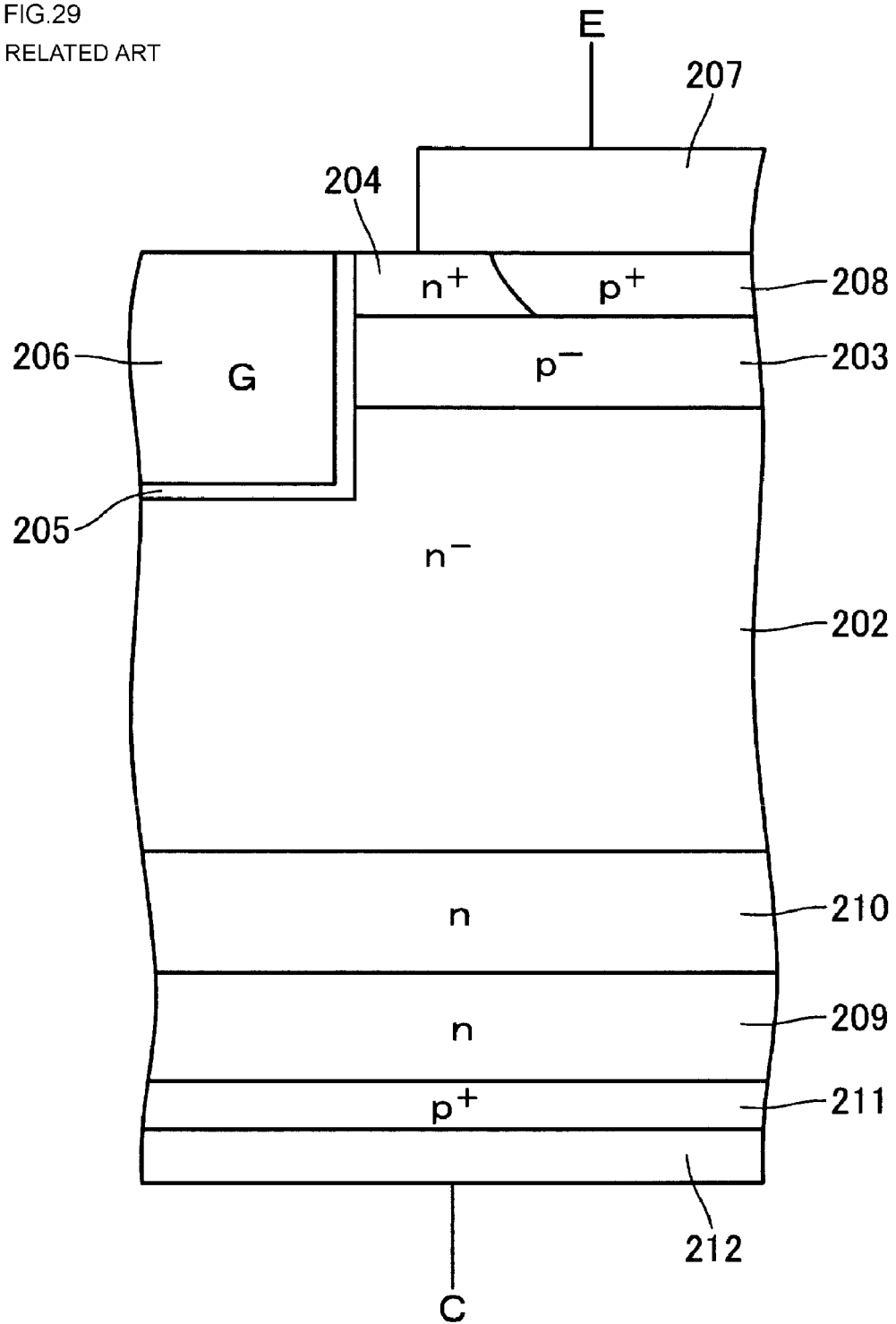
FIG. 29 is a sectional view showing another example of a heretofore known IGBT.
Figure 30:
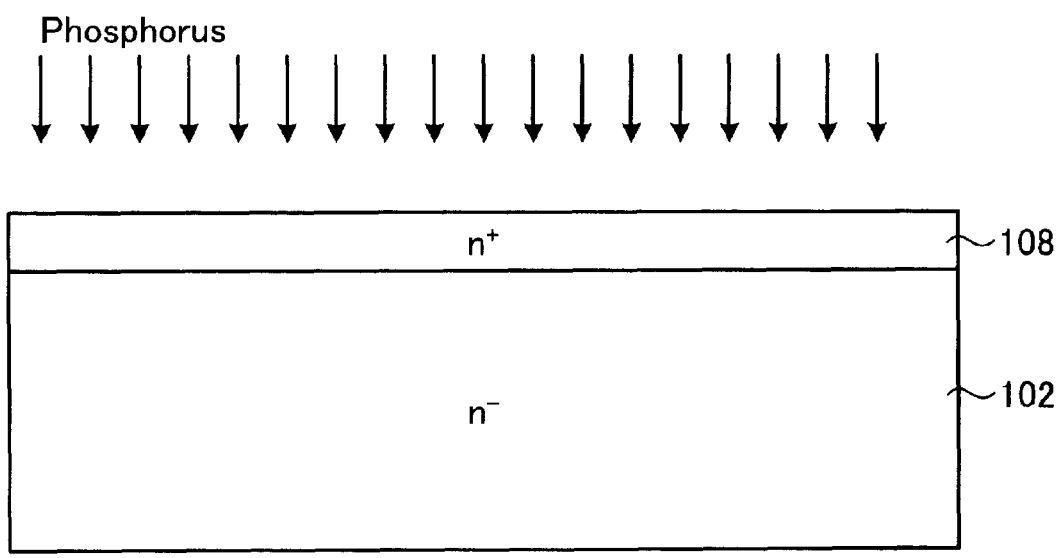
FIG. 30 is a sectional view sequentially showing a method of manufacturing another example of a heretofore known IGBT.
Figure 31:
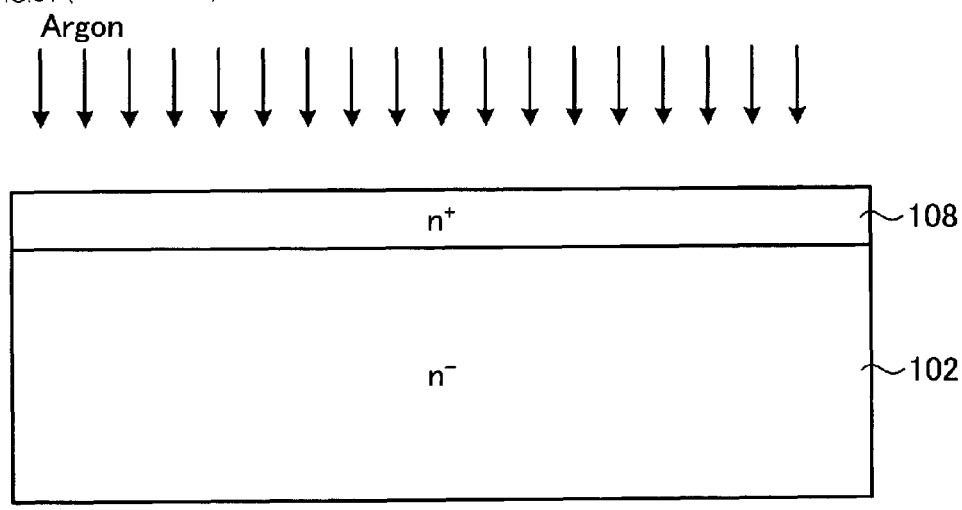
FIG. 31 is a sectional view sequentially showing a method of manufacturing another example of a heretofore known IGBT.
Figure 32:
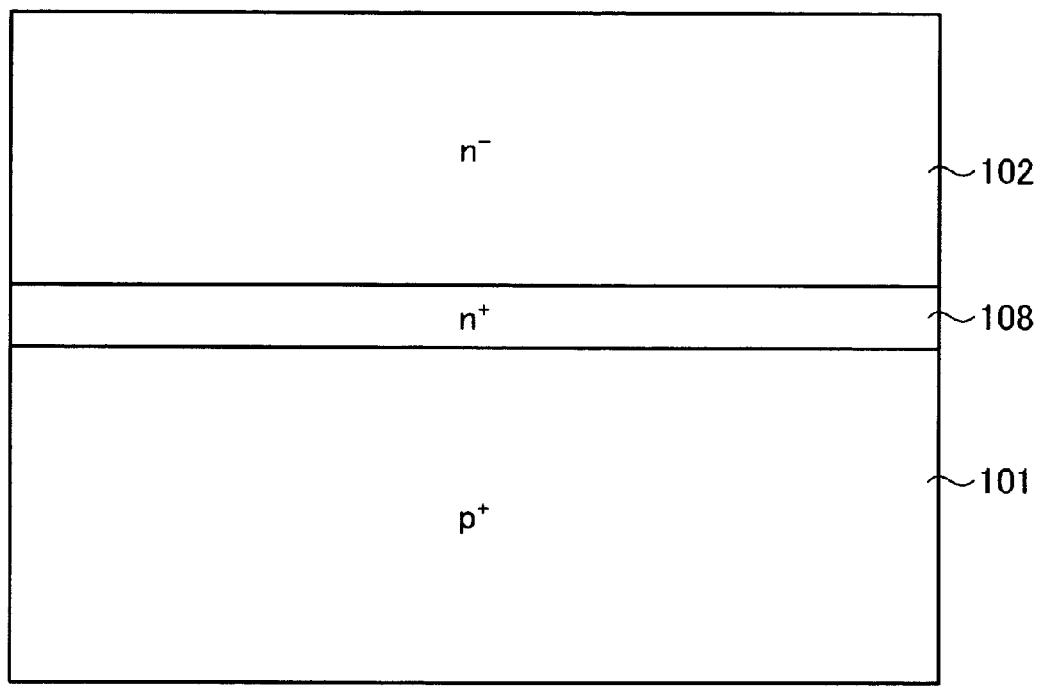
FIG. 32 is a sectional view sequentially showing a method of manufacturing another example of a heretofore known IGBT.
Figure 33:
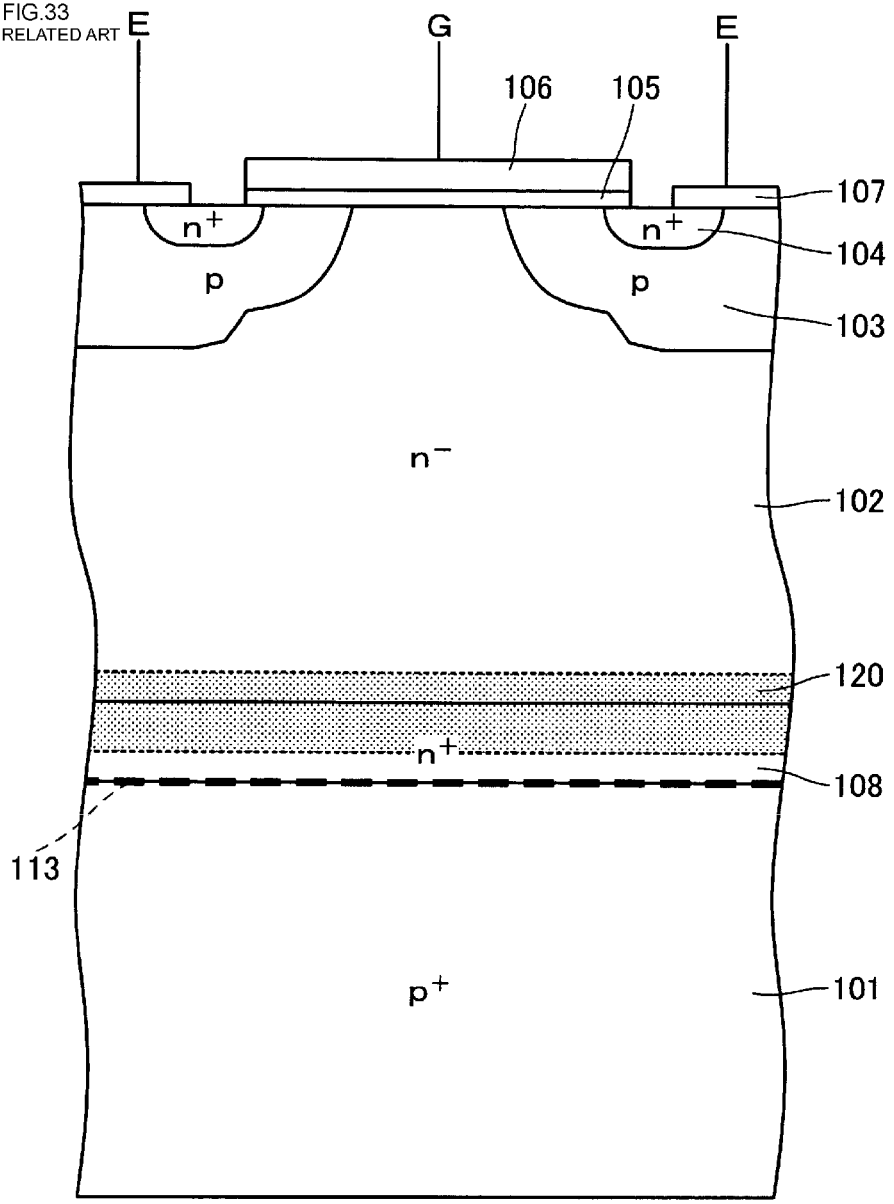
FIG. 33 is a sectional view sequentially showing a method of manufacturing another example of a heretofore known IGBT.
Figure 34:
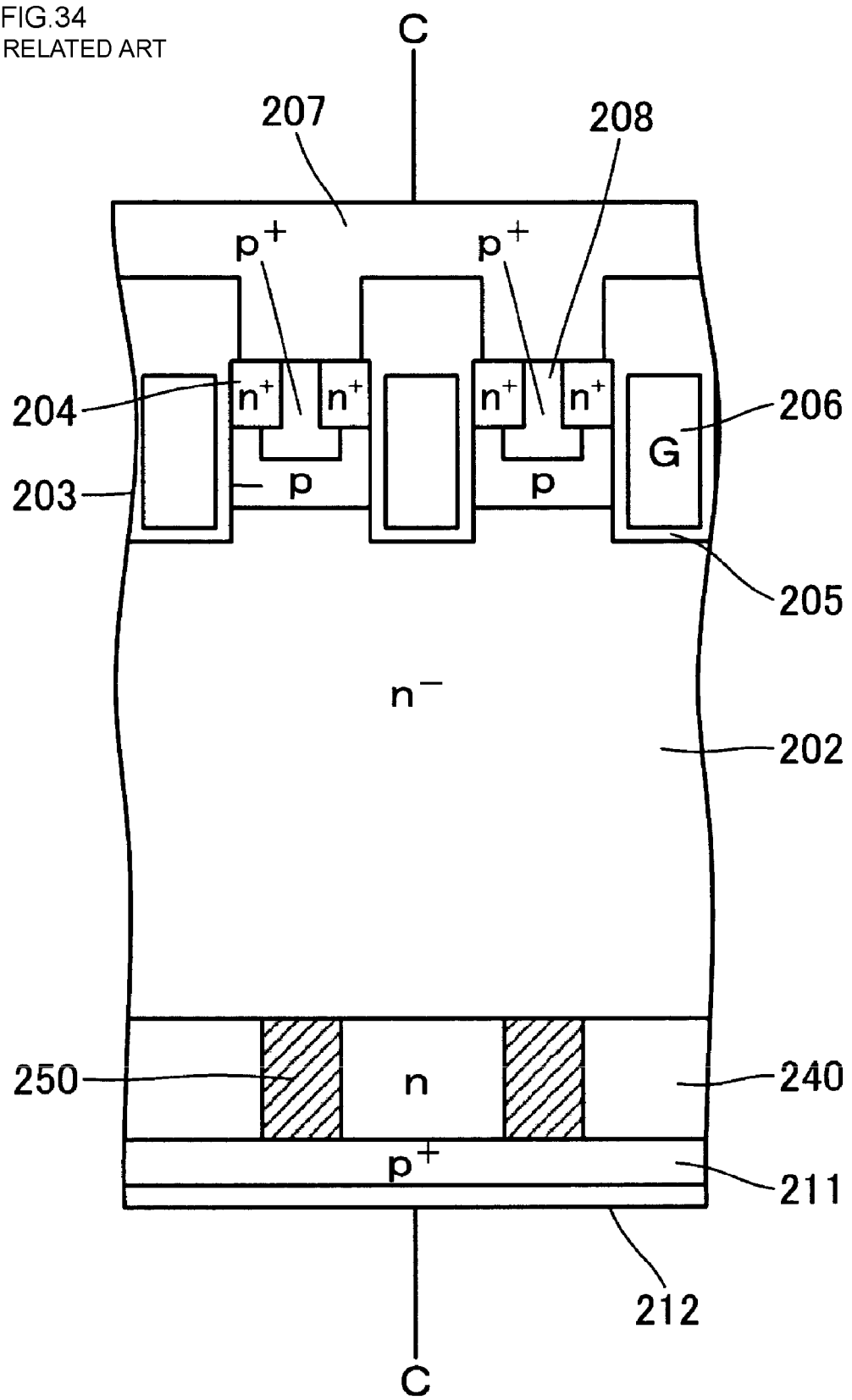
FIG. 34 is a sectional view showing another example of a heretofore known IGBT.

In Embodiment 3, a trench that penetrates the p-base region 2 and reaches the n⁻ drift region 1 is provided on the front surface side of the n⁻ drift region 1. The gate electrode 6 is embedded inside the trench, across the gate insulating film 5a. The n⁺ emitter region 3 neighbors the gate electrode 6 across the gate insulating film 5a provided on the side walls of the trench. That is, a trench gate structure is formed (refer to FIG. 27). Configurations other than this are the same as in Embodiment 1.

As heretofore described, according to Embodiment 3, it is possible to obtain the same advantages as in Embodiment 1.

Embodiment 4

In the semiconductor device according to Embodiment 4, the IGBT according to Embodiments 1 to 3 may be a punch through type, a soft punch through type, or a field stop type IGBT.

In Embodiment 4, an n-buffer region (fifth semiconductor region) is formed between the n⁻ drift region 1 and p⁺ collector region 8. The n-buffer region has a resistivity lower than that of the n⁻ drift region 1. Also, it is preferable that the n-buffer region is sufficiently activated. The p⁺ collector region 8, being in contact with the n-buffer region, forms a p-n junction with the n-buffer region. The low-lifetime region 10 is provided at the interface between the n-buffer region and p⁺ collector region 8.

Also, the low-lifetime region 10 is partially electrically activated in accordance with the concentration distribution of a p-type impurity such as, for example, boron, implanted into the p⁺ collector region 8. That is, the portion of the low-lifetime region 10 provided in the n-buffer region has the same conditions as the portion provided in the n⁻ drift region 1 in Embodiment 1. Configurations other than this are the same as in Embodiments 1 to 3.

Figure 16:
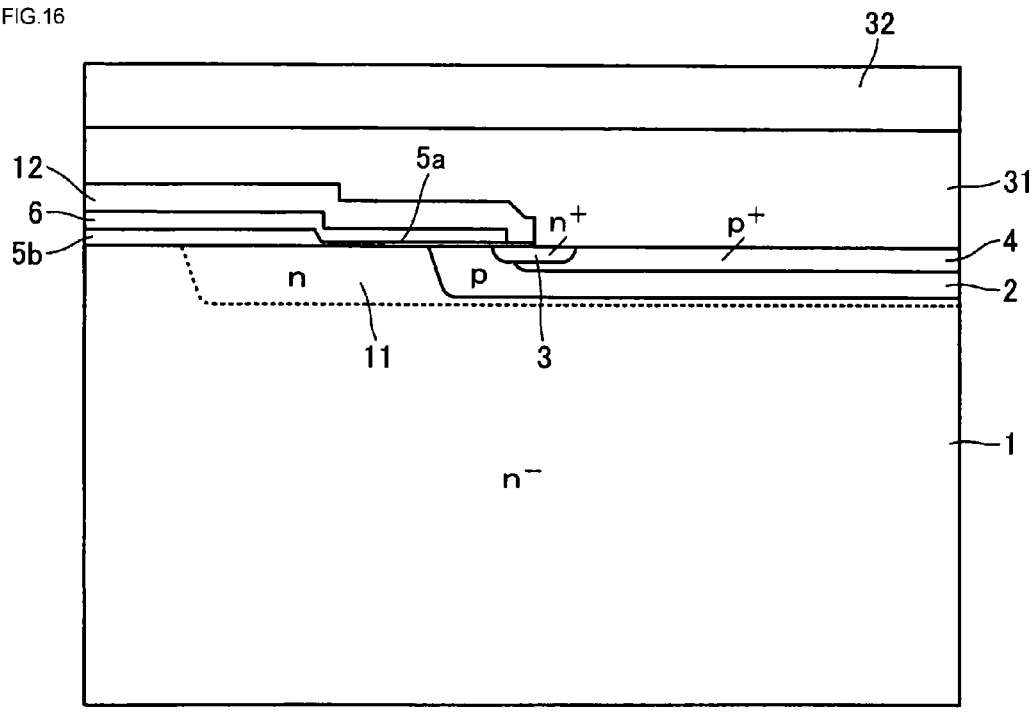
FIG. 16 is a sectional view showing a manufacturing process of a semiconductor device according to Embodiment 4.

FIGS. 16 to 20 are sectional views showing a manufacturing process for the semiconductor device according to Embodiment 4. Firstly, the processes as far as the FIG. 12 are carried out in the same way as in Embodiment 1 (refer to FIGS. 2 to 12). Next, a protective resist 31 is applied and hardened, as shown in FIG. 16. Next, a BG tape 32 is attached onto the protective resist 31. Next, the n⁻ drift region 1 is ground from the rear surface side of the n⁻ drift region 1, thereby thinning the FZ wafer.

Figure 17:
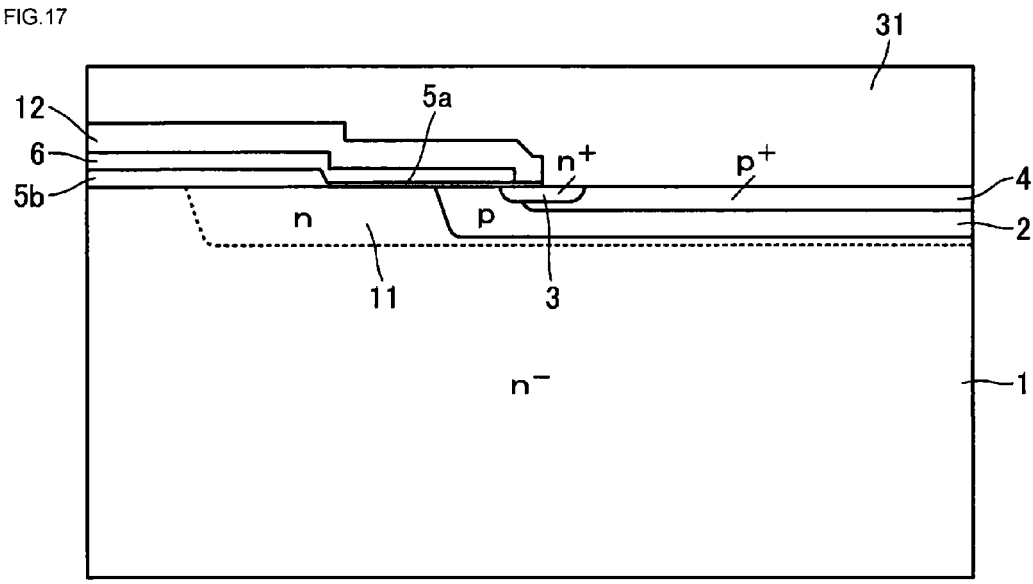
FIG. 17 is a sectional view showing a manufacturing process of the semiconductor device according to Embodiment 4.

Then, as shown in FIG. 17, the BG tape 32 is removed, and the FZ wafer is cleaned. Next, the whole of the rear surface of the n⁻ drift region 1 is uniformly removed by etching, thereby thinning the FZ wafer to in the region of 5 μm or more, 20 μm or less. The reason for this is the same as in Embodiment 1. In an IGBT having a breakdown voltage of 1,700V, the eventual thickness of the FZ wafer may be 245 μm or more, 285 μm or less.

Figure 18:
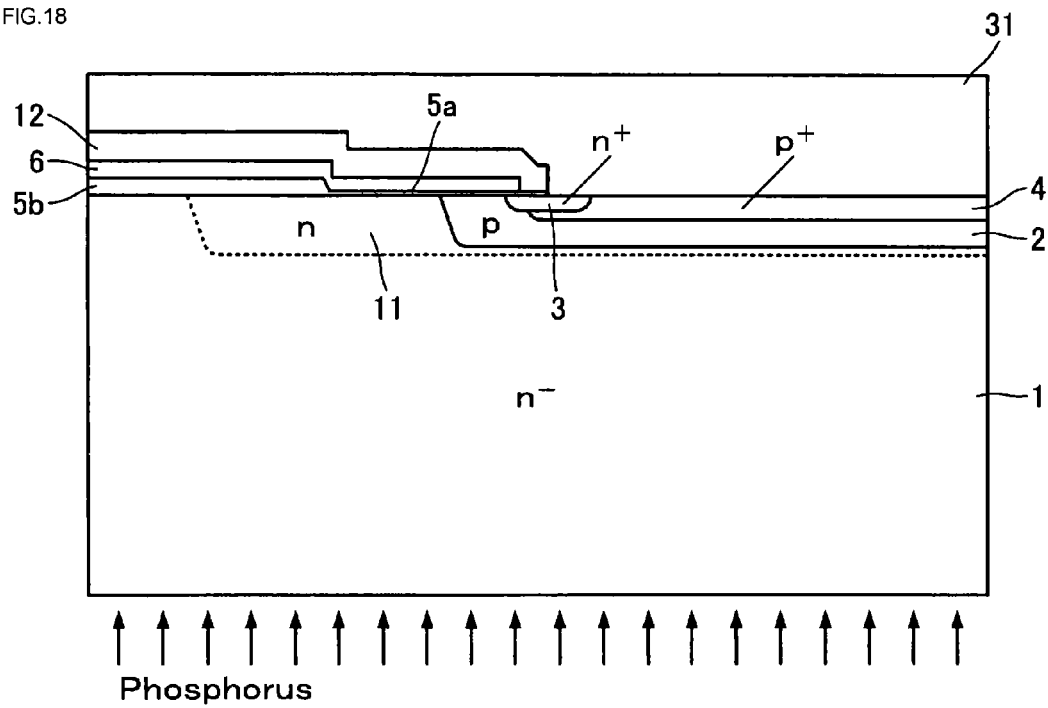
FIG. 18 is a sectional view showing a manufacturing process of the semiconductor device according to Embodiment 4.

Next, as shown in FIG. 18, n-type impurity ions such as, for example, phosphorus ions, are implanted into the rear surface of the n⁻ drift region 1. Herein, when using phosphorus as a dopant when forming a soft punch through type or field stop type IGBT, it is preferable that the ion implantation dose is $2.5 \times 10^{12}$ cm$^{-2}$ or more, $4.0 \times 10^{12}$ cm$^{-2}$ or less. In this way, an impurity region that is to form the n-buffer region is formed in the surface layer of the rear surface of the n⁻ drift region 1.

Figure 19:
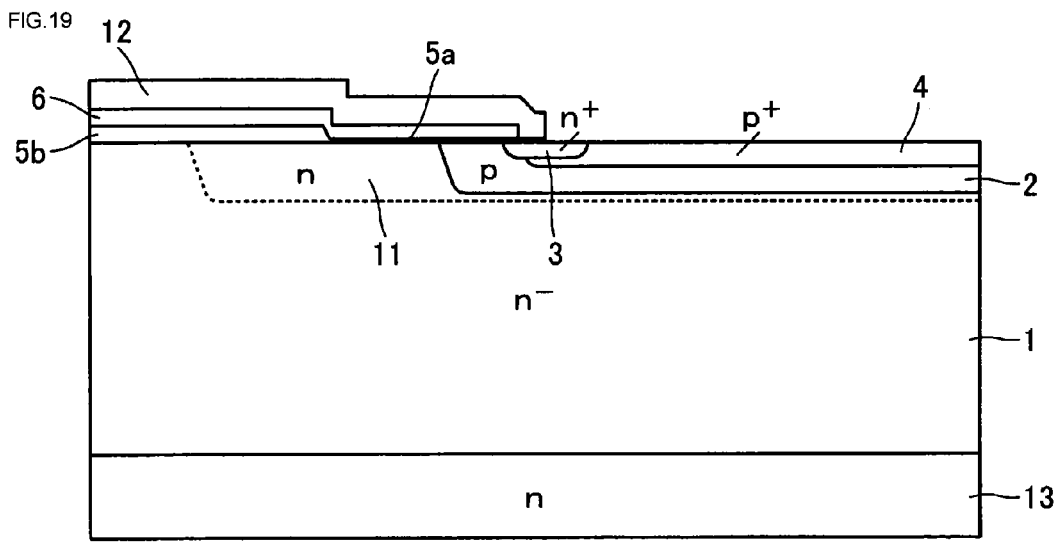
FIG. 19 is a sectional view showing a manufacturing process of the semiconductor device according to Embodiment 4.

Next, as shown in FIG. 19, the protective resist 31 is removed, and the FZ wafer is cleaned. Next, the impurity region that is to form the n-buffer region is diffused using thermal diffusion treatment. For example, thermal diffusion treatment may be carried out for in the region of 60 minutes at 900° C. in an inert gas atmosphere. By so doing, an n-buffer region 13 is formed.

A natural oxide film formed in a portion that is to come in contact with the emitter electrode 7 on the front surface side of the n⁻ drift region 1 is removed, thereby exposing the portion of the front surface of the FZ wafer that is to come in contact with the emitter electrode 7. Next, in the same way as in Embodiment 1, the emitter electrode 7 is formed on the front surface side of the n⁻ drift region 1 (FIG. 13), and one portion of the emitter electrode 7 is exposed, forming a pad region.

Figure 20:
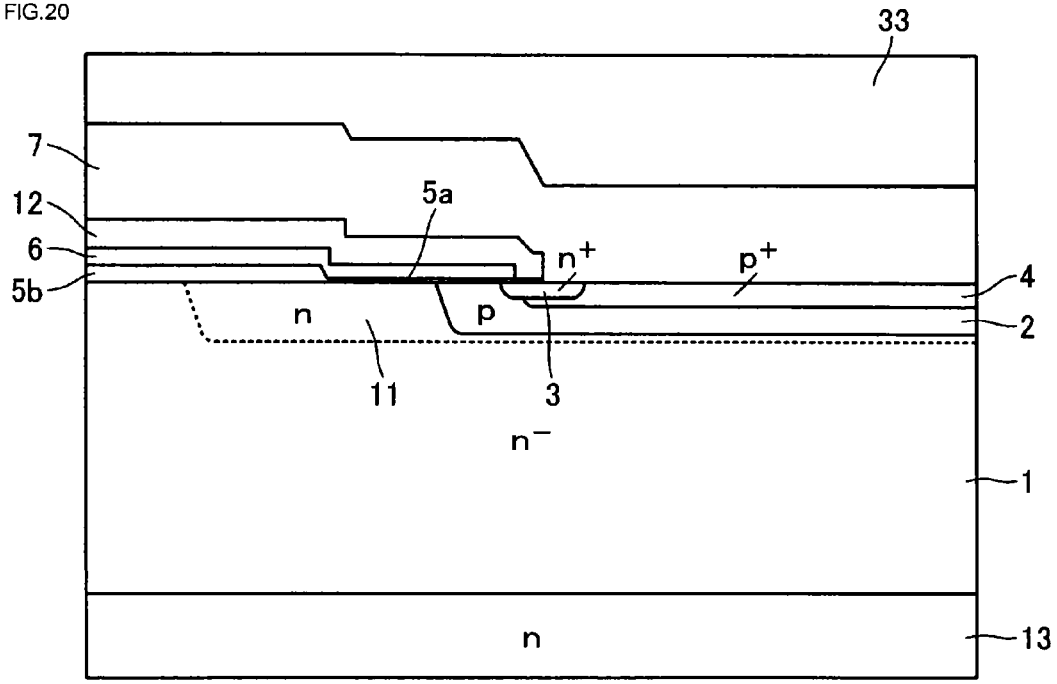
FIG. 20 is a sectional view showing a manufacturing process of the semiconductor device according to Embodiment 4.

Next, as shown in FIG. 20, a protective resist 33 is applied and hardened. Next, using etching, a natural oxide film formed on the surface of the n-buffer region 13 is removed until the silicon of the FZ wafer surface is exposed, exposing the rear surface of the FZ wafer. Next, in the same way as in Embodiment 1, the implantation process and activation process are carried out (FIG. 15), thereby forming the p⁺ collector region 8 and low-lifetime region 10 in the surface layer of the n-buffer region 13. In this way, the low-lifetime region 10 is formed at the interface between the n-buffer region 13 and p⁺ collector region 8. The low-lifetime region 10 formation method, and the conditions for depth, activation rate, and the like, are the same as in Embodiment 1. That is, the interface between the n⁻ drift region 1 and p⁺ collector region 8 in Embodiment 1 is replaced with the interface between the n-buffer region 13 and p⁺ collector region 8, with the conditions remaining the same.

In this way, a punch through type, non-punch through type, or field stop type IGBT with a configuration wherein the n-buffer region 13 is formed between the n⁻ drift region 1 and p⁺ collector region 8 is completed. Methods other than this are the same as in Embodiment 1. Also, the semiconductor device may be a reverse blocking IGBT, as in Embodiment 2, or may be an IGBT with a trench gate structure, as in Embodiment 3.

As heretofore described, according to Embodiment 4, it is possible to obtain the same advantages as in Embodiment 1.

Embodiment 1

Figure 21:
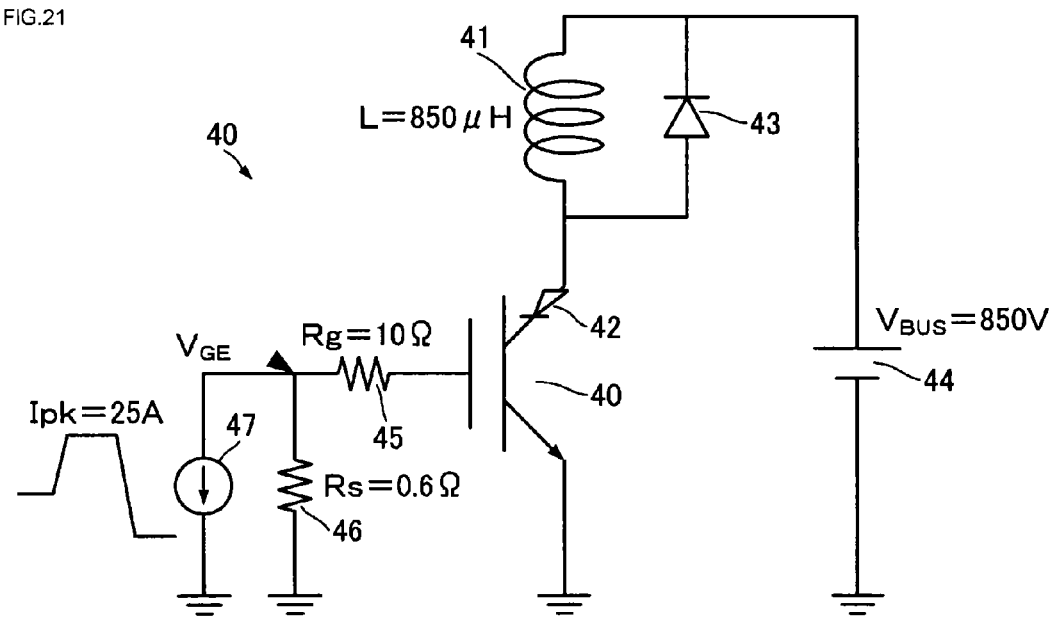
FIG. 21 is a diagram of a circuit that tests the electrical characteristics of the semiconductor device according to embodiments of the invention.
Figure 22:
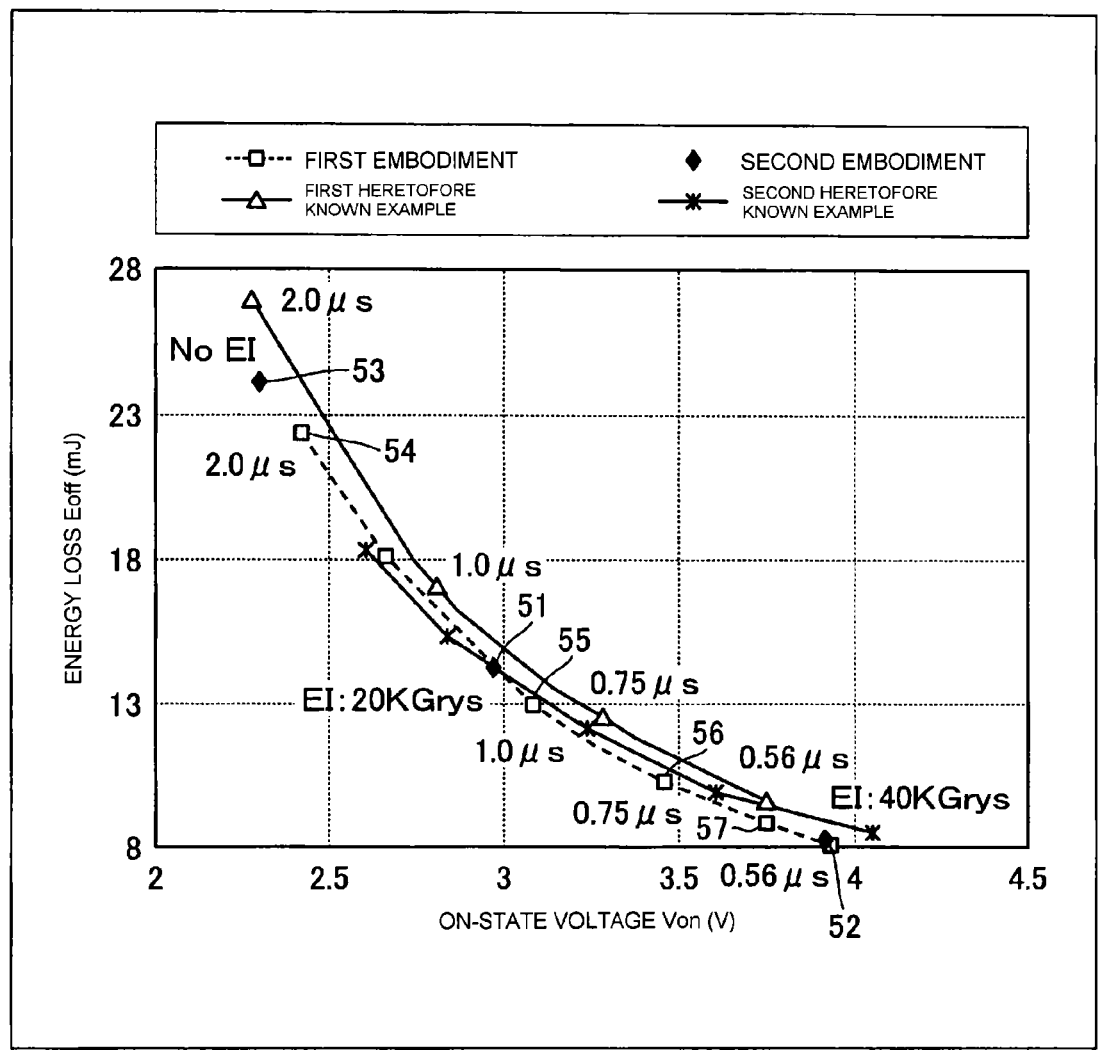
FIG. 22 is a characteristic diagram showing the relationship between the on-state voltage and energy loss of the semiconductor device according to embodiments of the invention.

FIG. 21 is a diagram of a circuit that tests the electrical characteristics of the semiconductor device according to embodiments of the invention. FIG. 22 is a characteristic diagram showing the relationship between the on-state voltage and energy loss of the semiconductor device according to embodiments of the invention. Firstly, with the non-punch through type IGBT shown in Embodiment 1 (refer to FIG. 1), the lifetime is variously changed, and the on-state voltage and energy loss in each lifetime are simulated (hereafter referred to as a first embodiment). Also, a plurality of non-punch through type IGBTs are actually fabricated in accordance with Embodiment 1, and the on-state voltage and energy loss measured for each IGBT (hereafter referred to as a second embodiment).

The conditions of the first and second embodiments are as follows. The breakdown voltage is 1,700V. The length (first length) LT from the gate insulating film 5a side in contact with one end portion of the oxide film region 5b to the gate insulating film 5a in contact with the other end portion is 23 μm. The length (second length) Lch of the gate insulating film 5a in the same direction as the direction in which the first length LT is measured is 9.5 μm. The thickness Tsub of the FZ wafer after the completion of the IGBT is 265 μm. The dose for forming the n-region 11 is $1.25 \times 10^{12}$ cm$^{-2}$. The cell pitch between the plurality of IGBTs formed on the FZ wafer is 47 μm.

Also, in the second embodiment, before forming the p⁺ collector region 8 and low-lifetime region 10, the rear surface of the n⁻ drift region 1 is irradiated with an electron beam of 4.6 MeV, after which thermal annealing is carried out for 60 minutes at 330° C. Also, in the implantation process, the dopant is boron, the first acceleration energy is 150 keV, and the dose is $2.0 \times 10^{14}$ cm$^{-2}$ for the first ion implantation. For the second ion implantation, the dopant is boron, the second acceleration energy is 45 keV, and the dose is $2.0 \times 10^{14}$ cm$^{-2}$. In the activation process, a YAG laser with an irradiation energy density of $1.3 \times 10^{-3}$ J/cm$^2$ or more, $1.8 \times 10^{-3}$ J/cm$^2$ or less, and a wavelength of 532 nm, is used, and annealing is performed while scanning so that the laser irradiation ranges overlap. At this time, the electron beam intensity of the laser irradiation is variously changed. Specifically, as shown in FIG. 22, an electron beam intensity EI at a measurement point 51 in an element wherein the on-state voltage is measured as approximately 3.0V is 20 KGrys, while the electron beam intensity EI at a measurement point 52 in an element wherein the on-state voltage is measured as approximately 3.9V is 40 KGrys. Also, no electron beam irradiation is carried out at a measurement point 53 in an element wherein the on-state voltage is measured as approximately 2.3V (No EI).

The evaluation circuit shown in FIG. 21 is used in the heretofore described simulation of the first embodiment and experiment of the second embodiment. As shown in FIG. 21, in an evaluation circuit wherein a coil 41 and diodes 42 and 43 are connected to the collector of an IGBT 40, the on-state voltage and energy loss of the IGBT 40 are evaluated by simulating the turning on and turning off processes of the IGBT 40. In FIG. 21, reference numeral 44 is a power source, reference numeral 45 is a gate resistor, reference numeral 46 is a sense resistor, and reference numeral 47 is a fixed current source. In the evaluation circuit shown in FIG. 21, 850V is applied as a bus voltage $V_{BUS}$ to the collector of the IGBT 40, an inductance L of the coil 42 is 850 µH, and the parasitic inductance of a current path from the collector of the IGBT 40 to the power source 44 is 300 µH. A resistance value Rg of the gate resistor 45 is 10Ω, a resistance value Rs of the sense resistor 46 is 0.6Ω, and the value of a peak current Ipk of the fixed current source 47 is 25 A. Under these conditions, with the first and second embodiments as the IGBT 40, the on-state voltage and energy loss of the first and second embodiments are evaluated by simulating the turning on and turning off processes.

As a comparison, with a heretofore known non-punch through type IGBT of a configuration wherein no low-lifetime region 10 is provided, the lifetime is variously changed, and the on-state voltage and energy loss in each lifetime simulated. Two kinds of IGBT (hereafter referred to as first and second heretofore known examples), wherein the doses for forming the p-collector region differ, are investigated. The dose for forming the p-collector region is $4.0 \times 10^{14}$ cm$^{-2}$ in the first heretofore known example, and $5.0 \times 10^{13}$ cm$^{-2}$ in the second heretofore known example. Configurations of the first and second heretofore known examples other than this are the same as in the first and second embodiments. The evaluation circuit used in the simulation of the first heretofore known example is the same as that in the first and second embodiments (refer to FIG. 21).

Next, the lifetimes of the first and second embodiments and first and second comparison examples are calculated as follows. Firstly, the dependency of a lifetime τi on doping concentration in the first and second comparison examples is calculated using the Scharfetter model shown in the following Equation (1).

$$\tau = \tau_{min0} + (\tau_{max0} - \tau_{min0})/(1 + (N/N_{ref})^\gamma) \quad (1)$$

Herein, $\tau_{min0}$ is the lifetime when there is a high doping concentration, $\tau_{max0}$ is the lifetime when there is a low doping concentration, N is the doping concentration, $N_{ref}$ is a standardized parameter (taken to be $1 \times 10^{16}$ cm$^{-3}$) of the concentration, and γ is a fitting parameter (whose value is 1). It is taken that $\tau_{min0}=0$. The lifetime of the holes is one-third that of the electrons, that is, $\xi=\tau_{max,n0}/\tau_{max,p0}=3$. The lifetime of each measurement point shown in FIG. 22 is $\tau_{max0}$ of the electrons. The trap level energy level due to electron beam irradiation is calculated using Shockley-Read-Hall's excess carrier recombination model (SRH model), and taken to be 0.32 eV, with the band gap level of the middle layer (n⁻ drift region 1) of a three-junction structure as a reference.

In the first and second embodiments, it is taken that a lifetime distribution $\tau_{max0}(y)$ in the p⁺ collector region 8 and low-lifetime region 10 satisfies the following Equation (2) as a depth y in the depth direction of the p collector region 8 from the interface between the p⁺ collector region 8 and collector electrode 9.

$$\tau_{max0}(y) = \tau'_{max0} - (\tau'_{max0} - \tau'_{min0}) \times \Delta p(y)/\Delta p_{max} \quad (2)$$

Herein, $\tau'_{max0}$ is the lifetime of the n⁻ drift region 1. As shown in FIG. 22, $\tau_{max0}$ is 2.0 µs at a measurement point 54, 1.0 µs at a measurement point 55, 0.75 µs at a measurement point 56, and 0.56 µs at a measurement point 57. Also, $\tau'_{min0}$ is the minimum lifetime in the region 10, and $\Delta p_{max}$ is the maximum difference between a SIMS profile and SSR profile of the p⁺ collector region 8. $\Delta p(y)$ is the concentration distribution of the difference (hereafter referred to as the non-active state boron concentration distribution difference) between the boron concentration distribution in an electrically active state based on actual measurement (hereafter referred to as the active state boron concentration distribution based on actual measurement) in the p⁺ collector region 8 and the boron concentration distribution analyzed by secondary ion mass spectrometry (SIMS) (hereafter referred to as the boron concentration distribution according to SIMS). The active state boron concentration distribution based on actual measurement is taken to be the distribution of the actual value of a spreading sheet resistance (SSR) in the second embodiment. It is taken to be $\xi=\tau_{max,n0}/\tau_{max,p0}=3$.

From the results shown in FIG. 22, it can be seen that the measurement points of the second embodiment are positioned on the curve of the first embodiment. That is, it is presumed that the results of the simulation in the first embodiment and the results of the experiment in the second embodiment coincide. Also, the on-state voltage and energy loss of the first and second embodiments are both lower than in the first heretofore known example. The on-state voltage and energy loss of the first and second embodiments fabricated using laser are lower than in the second heretofore known example. Because of this, it can be seen that it is possible to improve the trade-off relationship between the on-state voltage $V_{on}$ and energy loss $E_{off}$ in the IGBT of embodiments of the invention in comparison with the heretofore known IGBT.

Figure 23:
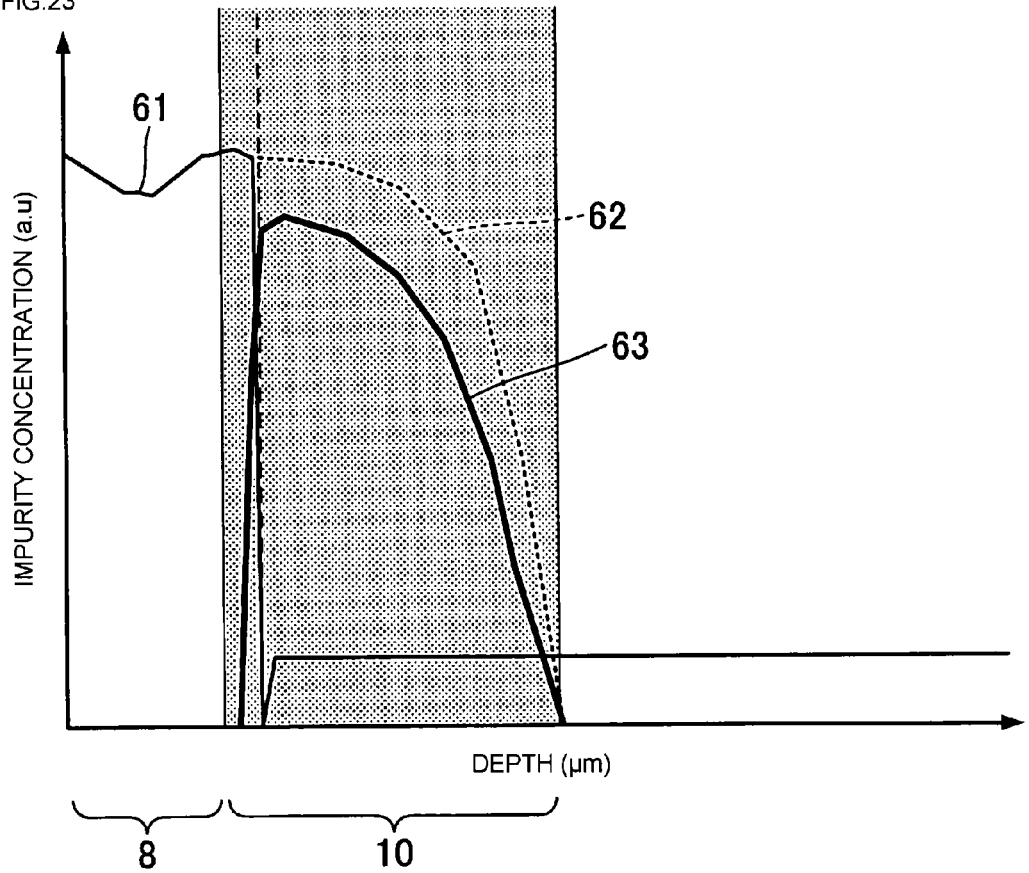
FIG. 23 is a characteristic diagram schematically showing the impurity concentration distribution of the semiconductor device according to embodiments of the invention.
Figure 24:
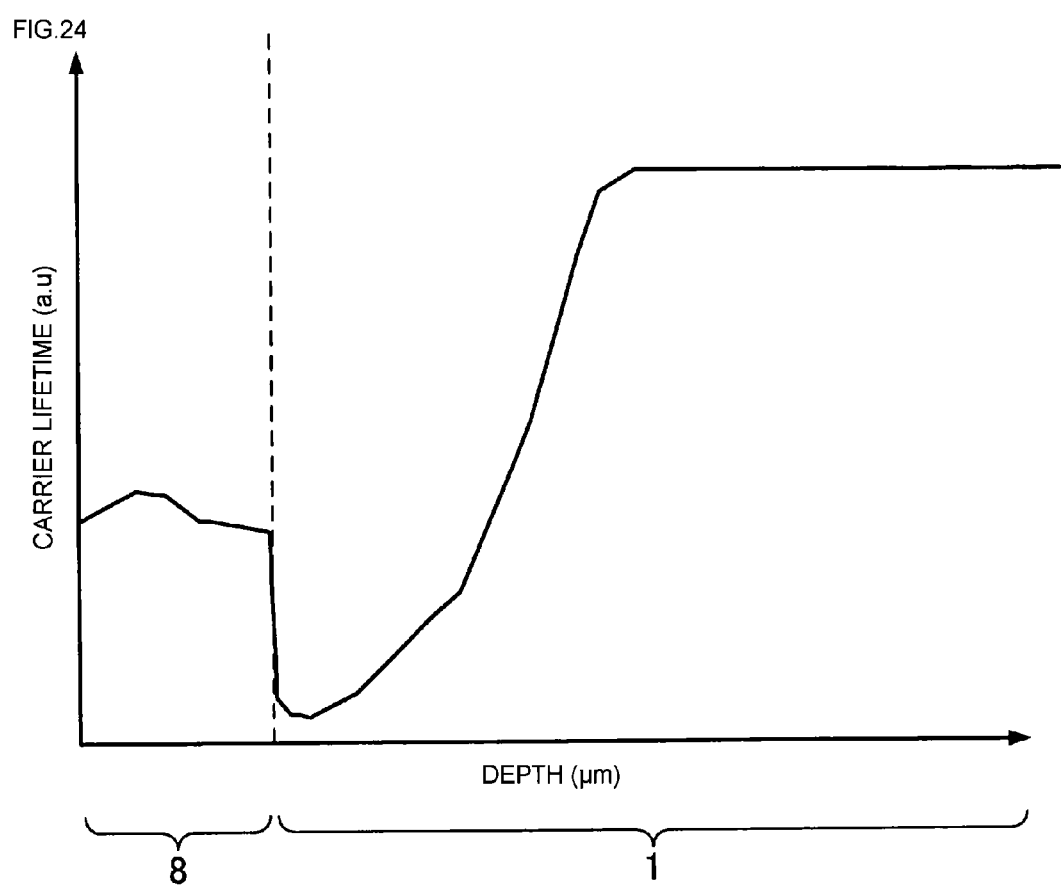
FIG. 24 is a characteristic diagram schematically showing the lifetime distribution of the semiconductor device according to embodiments of the invention.

FIG. 23 is a characteristic diagram schematically showing the impurity concentration distribution of the semiconductor device according to embodiments of the invention. A p-collector region active state boron concentration distribution 61 based on actual measurement, a boron concentration distribution 62 according to SIMS, and a non-active state boron concentration distribution difference 63 ($\Delta p(y)$ region) are shown in FIG. 23. Also, FIG. 24 is a characteristic diagram schematically showing the lifetime distribution of the semiconductor device according to embodiments of the invention. The lifetime distribution $\tau_{max0}$ (y) of the p⁺ collector region 8 and low-lifetime region 10 of the semiconductor device is shown in FIG. 24. In the first and second embodiments, as heretofore described, the total dose of the two ion implantations in the implantation process is $4.0 \times 10^{14}$ cm$^{-2}$. However, the boron ions implanted into the deeper portion of the n⁻ drift region 1 in the second ion implantation with the second acceleration energy higher than that of the first ion implantation, having a low activation rate, are barely activated.

Figure 25:
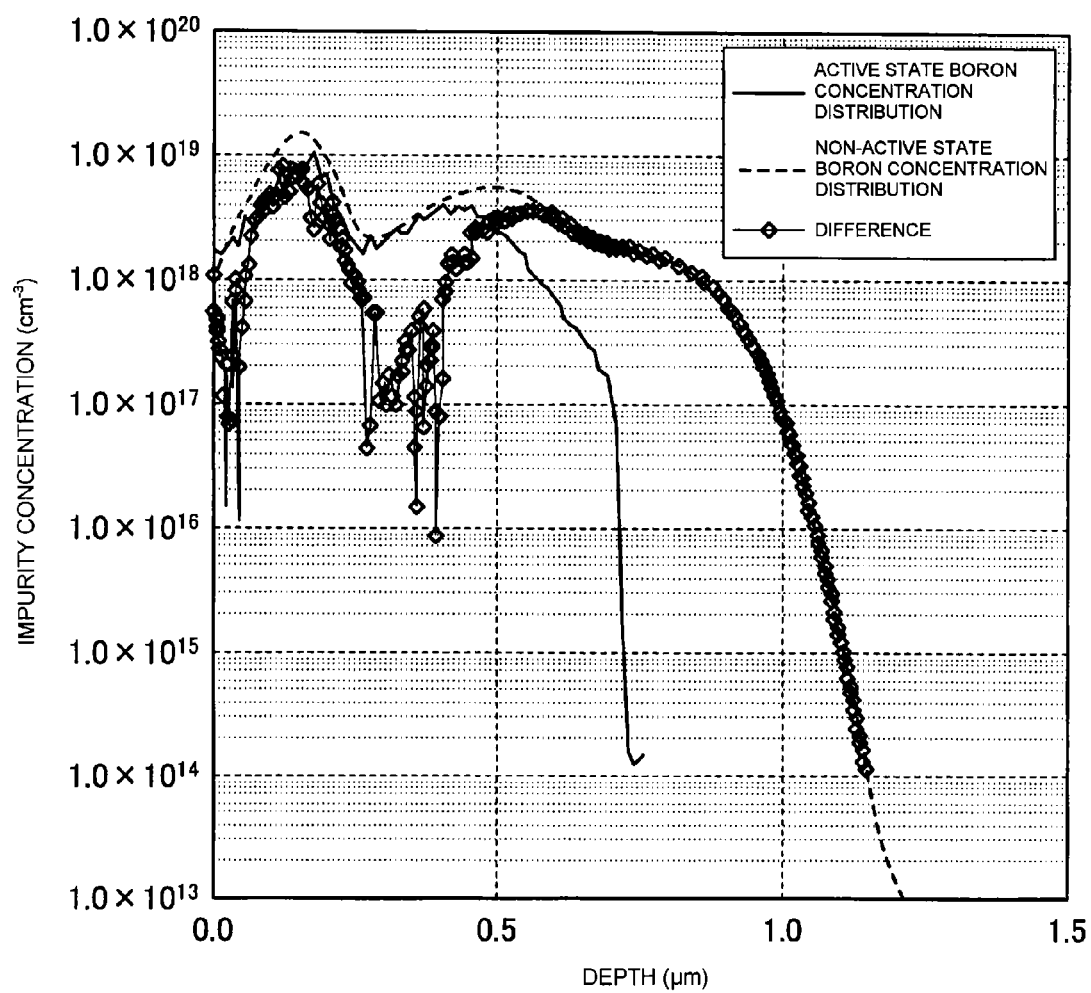
FIG. 25 is a characteristic diagram showing boron concentration distributions of the semiconductor device according to embodiments of the invention.
Figure 26:
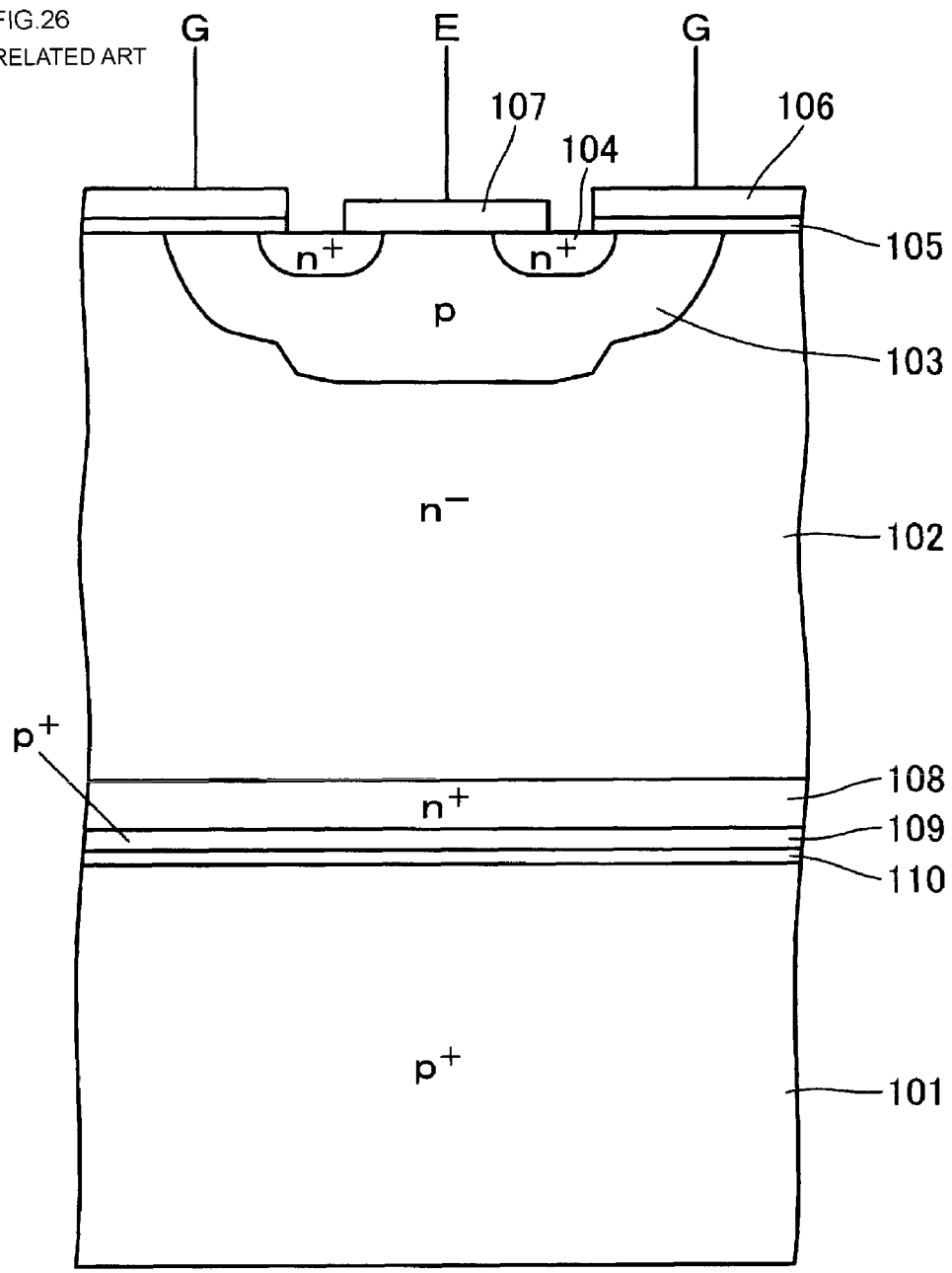
FIG. 26 is a sectional view showing a heretofore known IGBT.

Specifically, the electrically active state boron dose calculated from the active state boron concentration distribution 61 is approximately one half of the boron dose ion implanted into the p⁺ collector region 8 (refer to FIG. 25, to be described hereafter). Because of this, the non-active state boron concentration distribution difference 63 acts as a region for reducing lifetime (hereafter referred to as a lifetime killer region), suppressing the implantation of minority carriers (holes) from the p$^+$ collector region 8 into the n$^-$ drift region 1 when turning on, and thereby reducing lifetime, as shown in FIG. 24. Because of this, it is possible to reduce the on-state voltage V$_{on}$. Meanwhile, when turning off, the lifetime killer region accelerates the recombination of electrons on the collector electrode 9 side of the p$^+$ collector region 8, thereby reducing the time for which the collector current flows. Because of this, it is possible to reduce the energy loss E$_{off}$. Consequently, it is possible to improve the trade-off relationship between the on-state voltage V$_{on}$ and energy loss E$_{off}$. The lifetime killer region exists inside the low-lifetime region 10, as shown in FIG. 23.

Also, even when a voltage near the guaranteed breakdown voltage is applied in a non-punch through type IGBT having only forward direction breakdown voltage, the low-lifetime region 10 being formed at the interface between the n$^-$ drift region 1 and p$^+$ collector region 8 means that a depletion layer extending from the n$^+$ emitter region 3 side does not reach the lifetime killer region (Δp(y) region) in the low-lifetime region 10. Because of this, no leakage current is emitted from the p-n junction formed by the n$^-$ drift region 1 and p$^+$ collector region 8 when turning off. Also, in a reverse blocking IGBT having reverse breakdown voltage too, the p-n junction between the n$^-$ drift region 1 and p$^+$ collector region 8 can be seen as being a junction wherein the carrier distribution on the p$^+$ collector region 8 side is extremely high (a one-sided abrupt junction), meaning that the depletion layer extends mostly in the low carrier concentration n$^-$ drift region 1 when a voltage near the reverse breakdown voltage is applied. Because of this, the volume of the depletion layer extending in the lifetime killer region is extremely small in comparison with the volume of the depletion layer extending in the n$^-$ drift region 1. Because of this, leakage current caused by carrier generation and recombination in the depletion layer is emitted from the n$^-$ drift region 1. Consequently, it is possible, by reducing the width of the lifetime killer region, to suppress the leakage current when turning off.

FIG. 25 is a characteristic diagram showing boron concentration distributions of the semiconductor device according to embodiments of the invention. Herein, the origin on the horizontal axis of FIG. 25 is the interface between the p$^+$ collector region 8 and collector electrode 9. The boron concentration distributions of the first and second embodiments are shown in FIG. 25. In FIG. 25, the non-active state boron concentration distribution is the ion implanted boron concentration distribution. As shown in FIG. 25, a boron dose of $1.92 \times 10^{14}$ cm$^{-2}$ exists as interstitial atoms, without being activated, in a place at a depth greater than 0.7 μm from the interface between the p$^+$ collector region 8 and collector electrode 9. As the total dose of the two ion implantations in the implantation process is $4.0 \times 10^{14}$ cm$^{-2}$, as heretofore described, it can be seen that a boron dose approximately one half of the dose of the two ion implantations in the implantation process is not activated. This region is the heretofore described lifetime killer region. Also, the active state boron concentration distribution and non-active state boron concentration distribution at a depth 0.4 μm or more, 1.2 μm or less, from the interface between the p$^+$ collector region 8 and collector electrode 9, not being on the same curve, do not coincide. That is, non-activated boron exists at a depth 0.4 μm or more, 1.2 μm or less, from the interface between the p$^+$ collector region 8 and collector electrode 9. Because of this, it can be seen that it is preferable that a depth as far as 0.4 μm or more, 1.2 μm or less, from the interface between the p$^+$ collector region 8 and collector electrode 9 is taken to be the low-lifetime region 10.

Embodiments of the invention, not being limited to the heretofore described embodiments, can also have a configuration wherein all the n-types and p-types are reversed.

INDUSTRIAL APPLICABILITY

As heretofore described, the semiconductor device and semiconductor device manufacturing method according to embodiments of the invention are useful in a power semiconductor device used in a power conversion device, or the like.

DESCRIPTION OF REFERENCE NUMERALS AND SIGNS 1 n$^-$ drift region
2 p-base region
3 n$^+$ emitter region
4 p$^+$ contact region
5a Gate insulating film
5b Oxide film region
6 Gate electrode
7 Emitter electrode
8 p$^+$ collector region
9 Collector electrode
10 Low-lifetime region
11 n-region Although a few embodiments have been shown and described, it would be appreciated by those skilled in the art that changes may be made in these embodiments without departing from the principles and spirit of the invention, the scope of which is defined in the claims and their equivalents.

What is claimed is:

1. A semiconductor device comprising:
  a gate electrode;
  a first conductivity type first semiconductor region having a first side facing toward the gate electrode, and a second side facing away from the gate electrode;
  a second conductivity type second semiconductor region, in contact with the second side of the first semiconductor region, that forms a p-n junction with the first semiconductor region; and
  a low-lifetime region provided at the interface between the first semiconductor region and the second semiconductor region, having activated impurities of the second conductivity type, being partially activated at an activation rate lower than that of the second semiconductor region, and having a carrier lifetime shorter than that in other regions.

2. The semiconductor device according to claim 1, wherein the low-lifetime region is provided extending from the first semiconductor region to the second semiconductor region.

3. The semiconductor device according to claim 2, wherein the low-lifetime region is provided at a depth 0.4 μm or more, 1.2 μm or less, from the surface on the side opposite the plane in which the second semiconductor region is in contact with the first semiconductor region.

4. The semiconductor device according to claim 1, wherein the activation rate of the low-lifetime region is lower than the activation rate of the second semiconductor region.

5. The semiconductor device according to claim 1, wherein a portion as far as a depth of 0.5 μm or more, 0.8 μm or less, from the surface on the side opposite the plane in which the second semiconductor region is in contact with the first semiconductor region is electrically activated.

6. The semiconductor device according to claim 1, further comprising:
- a second conductivity type third semiconductor region selectively provided in a surface layer of the first semiconductor region on the side opposite the plane on the side on which the second semiconductor region is provided;
- a first insulating film, provided extending from the first semiconductor region to the surface of the third semiconductor region, and on which the gate electrode is provided;
- a second insulating film, of a thickness greater than that of the first insulating film, provided in contact with the first insulating film on the surface of the first semiconductor region, and on which the gate electrode is provided;
- a first conductivity type fourth semiconductor region provided aligned with an end portion of the first electrode in one portion of a surface layer of the third semiconductor region;
- a second electrode in contact with the third semiconductor region and fourth semiconductor region; and
- a third electrode in contact with the second semiconductor region.

7. The semiconductor device according to claim 6, further comprising:
- a second conductivity type sixth semiconductor region selectively provided in the surface layer of the third semiconductor region, and covering a region below the fourth semiconductor region, with a resistivity lower than that of the third semiconductor region, wherein
- the second electrode is in contact with the fourth semiconductor region and sixth semiconductor region.

8. The semiconductor device according to claim 1, wherein the gate electrode is embedded across a first insulating film inside a trench penetrating the third semiconductor region and reaching the first semiconductor region, further comprising:
- a second conductivity type third semiconductor region selectively provided in a surface layer of the first semiconductor region on the side opposite the plane on the side on which the second semiconductor region is provided;
- a first conductivity type fourth semiconductor region selectively provided in the surface layer of the third semiconductor region and neighboring the gate electrode across the first insulating film provided on the side walls of the trench;
- a second electrode in contact with the third semiconductor region and fourth semiconductor region; and
- a third electrode in contact with the second semiconductor region.

9. The semiconductor device according to claim 8, further comprising:
- a second conductivity type sixth semiconductor region selectively provided in the surface layer of the third semiconductor region, and covering a region below the fourth semiconductor region, with a resistivity lower than that of the third semiconductor region, wherein
- the second electrode is in contact with the fourth semiconductor region and sixth semiconductor region.

10. The semiconductor device according to claim 1, further comprising:
- a termination structure surrounding the first semiconductor region;
- a second conductivity type isolation region surrounding the termination structure, being formed through the first semiconductor region from a front surface thereof to the back surface thereof, and being in contact with the second semiconductor region.

11. The semiconductor device according to claim 1, wherein the low-lifetime region is in contact with the second semiconductor region.

* * * * *